United States Patent
Nakahara

(10) Patent No.: US 10,491,845 B2
(45) Date of Patent: Nov. 26, 2019

(54) SIGNAL PROCESSING APPARATUS, CONTROL METHOD, IMAGE PICKUP ELEMENT, AND ELECTRONIC APPLIANCE WITH A COMPARISON UNIT CONTROLLED BY A CONTROL UNIT TO PROVIDE PERIODS OF REDUCED ELECTRICAL CURRENT

(71) Applicant: SONY CORPORATION, Tokyo (JP)

(72) Inventor: Tatsunori Nakahara, Fukuoka (JP)

(73) Assignee: Sony Corporation, Tokyo (JP)

( * ) Notice: Subject to any disclaimer, the term of this patent is extended or adjusted under 35 U.S.C. 154(b) by 79 days.

(21) Appl. No.: 15/524,415

(22) PCT Filed: Oct. 30, 2015

(86) PCT No.: PCT/JP2015/080665
§ 371 (c)(1),
(2) Date: May 4, 2017

(87) PCT Pub. No.: WO2016/076139
PCT Pub. Date: May 19, 2016

(65) Prior Publication Data
US 2018/0288345 A1    Oct. 4, 2018

(30) Foreign Application Priority Data
Nov. 14, 2014 (JP) .................. 2014-231257

(51) Int. Cl.
*H04N 5/335* (2011.01)
*H04N 5/369* (2011.01)
(Continued)

(52) U.S. Cl.
CPC ......... *H04N 5/3698* (2013.01); *H03K 5/2481* (2013.01); *H04N 5/357* (2013.01);
(Continued)

(58) Field of Classification Search
CPC .......... H03M 1/00–645; H04N 5/3355; H04N 5/3745; H04N 5/37455; H04N 5/378; H04N 5/335–378; H01L 27/146–14893
See application file for complete search history.

(56) References Cited

U.S. PATENT DOCUMENTS

2009/0166513 A1    7/2009  Abe et al.
2010/0253560 A1*  10/2010  Kudo .................. H03K 4/02
                                             341/143
(Continued)

FOREIGN PATENT DOCUMENTS

JP    11-355387 A     12/1999
JP    2008-136042     6/2008
(Continued)

OTHER PUBLICATIONS

International Search Report prepared by the Japan Patent Office dated Jan. 8, 2016, for International Application No. PCT/JP2015/080665.

*Primary Examiner* — Twyler L Haskins
*Assistant Examiner* — Selam T Gebriel
(74) *Attorney, Agent, or Firm* — Sheridan Ross P.C.

(57) ABSTRACT

The present technology relates to a signal processing apparatus, a control method, an image pickup element, and an electronic appliance that achieve the suppression of an increase in electric power consumption. The signal processing apparatus may be configured to control an amount of electric current at a differential stage in a comparison unit that compares signal levels of a plurality of signals and reduce the amount of electric current for a period other than this comparison period. For example, the amount of electric current may be reduced by turning off part of a group of switches each capable of disconnecting a path of an electric current from an electric current source In addition, for example, the amount of electric current may be reduced by (Continued)

causing a gate potential at the electric current source unit to decrease. The present technology can be applied to, for example, an image pickup element and an electronic appliance.

6 Claims, 26 Drawing Sheets

(51) Int. Cl.
*H04N 5/3745* (2011.01)
*H04N 5/378* (2011.01)
*H03K 5/24* (2006.01)
*H04N 5/357* (2011.01)
*H03M 1/56* (2006.01)
*H03M 1/12* (2006.01)

(52) U.S. Cl.
CPC ........... *H04N 5/378* (2013.01); *H04N 5/3745* (2013.01); *H03M 1/123* (2013.01); *H03M 1/56* (2013.01)

(56) References Cited

U.S. PATENT DOCUMENTS

| | | |
|---|---|---|
| 2011/0317051 A1 | 12/2011 | Abe et al. |
| 2013/0032695 A1* | 2/2013 | Ishibashi ................ H04N 5/378 250/208.1 |
| 2015/0187335 A1* | 7/2015 | Sugiyama ................ G09G 3/32 345/208 |

FOREIGN PATENT DOCUMENTS

| | | |
|---|---|---|
| JP | 2009-159271 A | 7/2009 |
| JP | 2013-038549 A | 2/2013 |
| JP | 2013-051527 A | 3/2013 |

* cited by examiner

SIGNAL PROCESSING APPARATUS, CONTROL METHOD, IMAGE PICKUP ELEMENT, AND ELECTRONIC APPLIANCE WITH A COMPARISON UNIT CONTROLLED BY A CONTROL UNIT TO PROVIDE PERIODS OF REDUCED ELECTRICAL CURRENT

CROSS REFERENCE TO RELATED APPLICATIONS

This application is a national stage application under 35 U.S.C. 371 and claims the benefit of PCT Application No. PCT/JP2015/080665 having an international filing date of 30 Oct. 2015, which designated the United States, which PCT application claimed the benefit of Japanese Patent Application No. 2014-231257 filed -14 Nov. 2014, the disclosures of which are incorporated herein by reference in their entirety.

TECHNICAL FIELD

The present technology relates to a signal processing apparatus, a control method, an image pickup element, and an electronic appliance. In particular, the technology relates to a signal processing apparatus, a control method, an image pickup element, and an electronic appliance configured to achieve the suppression of an increase in electric power consumption.

BACKGROUND ART

An A/D conversion technique regarded as a so-called single-slope integration type or ramp signal comparison type has been known in the past, in which A/D conversion technique, an analog unit signal and a ramp-shaped reference signal for conversion to digital data is compared with each other and, in parallel to this comparison processing, counting processing is carried out such that digital data of the unit signal is acquired on the basis of a count value at a time point when the comparison processing is completed (for example, refer to Patent Document 1).

CITATION LIST

Patent Document

Patent Document 1: Japanese Patent Application Laid-Open No. 2008-136042

SUMMARY OF THE INVENTION

Problems to be Solved by the Invention

In recent years, lower electric power consumption has been required to be achieved in an electronic circuit formed on a semiconductor substrate or the like. However, when a lower electric current is supplied to such an electronic circuit that performs A/D conversion in order to suppress an increase in electric power consumption, a response of a comparison unit that compares an analog unit signal and a reference signal slows down, causing a risk of the degradation of A/D conversion performance and, in particular, a high-speed characteristic in conversion processing. In other words, suppressing an increase in electric power consumption has been difficult while the maintenance of a sufficient high-speed characteristic in the A/D conversion is aimed.

The present technology has been proposed by taking such a situation in consideration and an object thereof is to achieve the suppression of an increase in electric power consumption.

Solutions to Problems

An aspect of the present technology is a signal processing apparatus including a control unit that controls an amount of electric current at a differential stage in a comparison unit configured to compare signal levels of a plurality of signals and, compared to a comparison period serving as a period during which the comparison unit compares the signal levels of the plurality of signals, reduces the amount of electric current for a period other than the comparison period.

The comparison unit includes, in the differential stage, a plurality of pairs of electric current source units each configured to supply an electric current and switches each capable of disconnecting a path of the electric current from the electric current source unit, which pairs are interconnected in parallel, and, by turning off the switch to disconnect the path of the electric current supplied by the electric current source unit for some of the plurality of pairs, the control unit is able to reduce the amount of electric current for the period other than the comparison period.

The control unit is able to set the switch to be turned off and turn off the set switch during the period other than the comparison period.

The comparison unit includes, in the differential stage, an electric current source unit configured to supply an electric current, and, by causing a gate potential at the electric current source unit to decrease, the control unit is able to reduce the amount of electric current for the period other than the comparison period.

The control unit is able to reduce the amount of electric current for an autozero period of the comparison unit, compared to the comparison period.

The comparison unit can be further included.

A counter can be further included, which performs counting until a result of the comparison of the signal levels among the plurality of signals by the comparison unit changes.

The plurality of signals can be configured to include a predetermined reference signal and a signal read from a unit pixel.

The comparison unit is able to compare the reference signal and a reset signal read from the unit pixel during a reset period of correlated double sampling and compare the reference signal and a pixel signal read from the unit pixel during a signal reading period of the correlated double sampling, and, compared to the comparison period during the reset period and the comparison period during the signal reading period, the control unit is able to reduce the amount of electric current for the period other than the comparison periods.

Meanwhile, an aspect of the present technology is a control method that controls an amount of electric current at a differential stage in a comparison unit configured to compare signal levels of a plurality of signals and, compared to a comparison period serving as a period during which the comparison unit compares the signal levels of the plurality of signals, reduces the amount of electric current for a period other than the comparison period.

Another aspect of the present technology is an image pickup element including a pixel array in which a plurality of unit pixels is arranged in a matrix form, a comparison unit that compares signal levels between a signal read from the unit pixel in the pixel array and a predetermined reference signal, a counter that performs counting until a result of the comparison of the signal levels by the comparison unit changes, and a control unit that controls an amount of electric current at a differential stage in the comparison unit and, compared to a comparison period serving as a period during which the comparison unit compares the signal levels between the signal read from the unit pixel and the reference signal, reduces the amount of electric current for a period other than the comparison period.

Still another aspect of the present technology is an electronic appliance including an imaging unit that images an object and an image processing unit that carries out image processing on image data obtained through imaging by the imaging unit, in which the imaging unit includes a pixel array in which a plurality of unit pixels is arranged in a matrix form, a comparison unit that compares signal levels between a signal read from the unit pixel in the pixel array and a predetermined reference signal, a counter that performs counting until a result of the comparison of the signal levels by the comparison unit changes, and a control unit that controls an amount of electric current at a differential stage in the comparison unit and, compared to a comparison period serving as a period during which the comparison unit compares the signal levels between the signal read from the unit pixel and the reference signal, reduces the amount of electric current for a period other than the comparison period.

According to the aspect of the present technology, the amount of electric current is controlled at the differential stage in the comparison unit configured to compare the signal levels of the plurality of signals and, compared to the comparison period serving as a period during which this comparison unit compares the signal levels of the plurality of signals, the amount of electric current is reduced for a period other than this comparison period.

According to the another aspect of the present technology, in the image pickup element including the pixel array in which the plurality of unit pixels is arranged in a matrix form, the amount of electric current is controlled at the differential stage in the comparison unit configured to compare the signal levels between the signal read from the unit pixel in this pixel array and the predetermined reference signal and, compared to the comparison period serving as a period during which this comparison unit compares the signal levels between the signal read from the unit pixel and the reference signal, the amount of electric current is reduced for a period other than the comparison period.

According to the still another aspect of the present technology, in the image pickup element of the electronic appliance, which image pickup element includes the pixel array in which the plurality of unit pixels is arranged in a matrix form, the amount of electric current is controlled at the differential stage in the comparison unit configured to compare the signal levels between the signal read from the unit pixel in this pixel array and the predetermined reference signal and, compared to the comparison period serving as a period during which this comparison unit compares the signal levels between the signal read from the unit pixel and the reference signal, the amount of electric current is reduced for a period other than the comparison period.

Effects of the Invention

According to the present technology, a signal can be processed. Additionally, according to the present technology, an increase in amount of consumed electric power can be suppressed.

MODE FOR CARRYING OUT THE INVENTION

Modes for carrying out the present disclosure (hereinafter, referred to as embodiments) will be described below. Note that the description will be given in the following order.

1. First Embodiment (Image Sensor)
2. Second Embodiment (Image Sensor)
3. Third Embodiment (Image Sensor)
4. Fourth Embodiment (Another Exemplary Configuration of Image Sensor)
5. Fifth Embodiment (Imaging Apparatus)

1. <First Embodiment>

<Electric Power Consumption and Response Speed of Comparison Unit>

There is an A/D conversion technique regarded as a so-called single-slope integration type or ramp signal comparison type, in which an analog unit signal and a ramp-shaped reference signal for conversion to digital data is compared with each other and, in parallel to this comparison processing, counting processing is carried out such that digital data of the unit signal is acquired on the basis of a count value at a time point when the comparison processing is completed.

Figure 1:
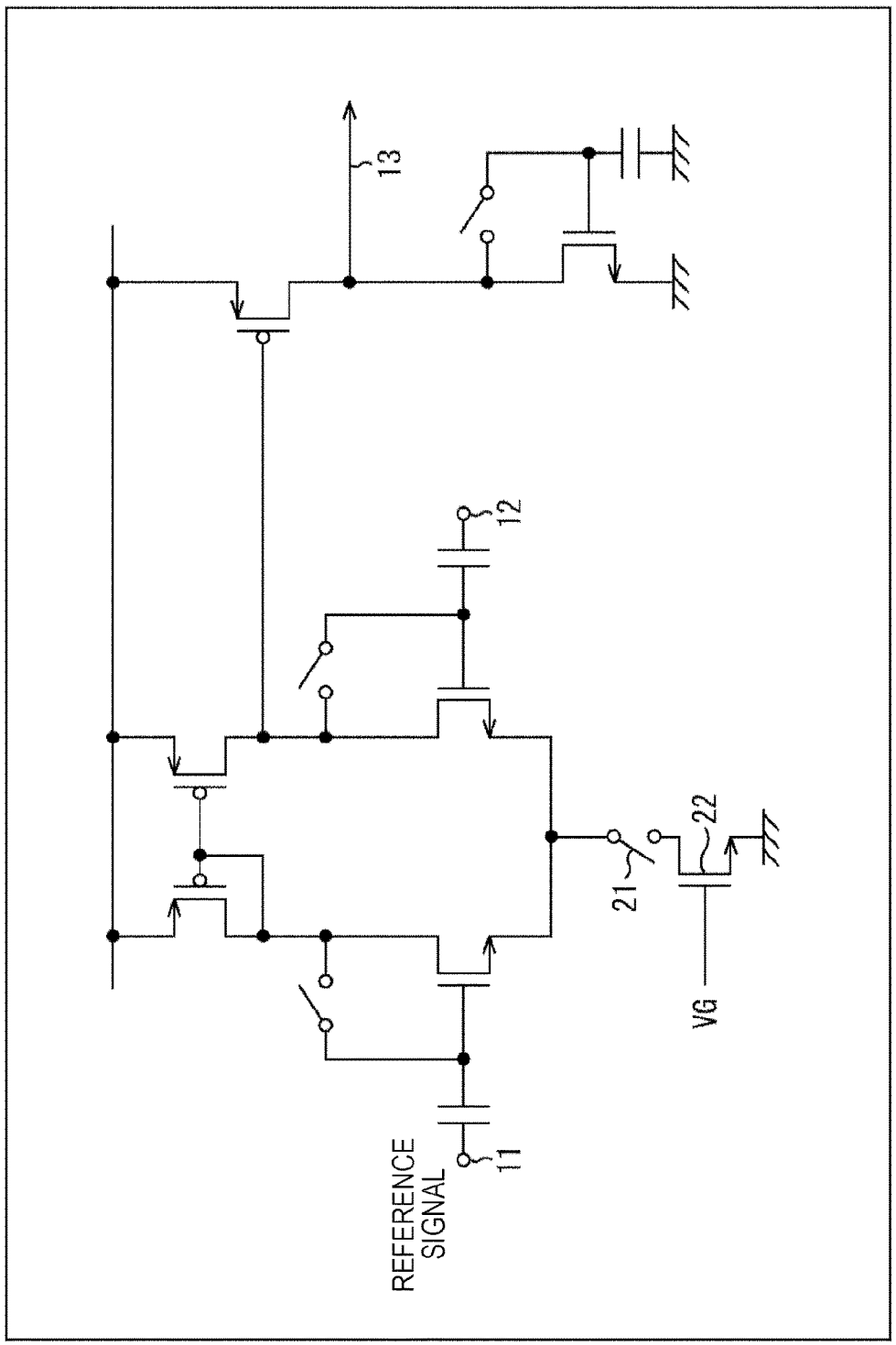
FIG. 1 is a diagram illustrating an exemplary main configuration of a comparison unit.

FIG. 1 illustrates an exemplary main configuration of a typical comparison unit used in such A/D conversion. As illustrated in FIG. 1, the typical comparison unit is constituted by a differential stage on the left side of the drawing and an amplifier stage on the right side of the drawing. This comparison unit compares the signal level of a signal input from an input terminal 12 at the differential stage with the signal level of a reference signal input from an input terminal 11 and then outputs a signal indicating a result of this comparison from an output terminal 13 at the amplifier stage.

A switch 21 and an electric current source unit 22 are provided at the differential stage. The electric current source unit 22 supplies an electric current in accordance with a gate potential VG. The switch 21 is capable of, when turned off, disconnecting an electric current path of the electric current source unit 22 on a drain side. That is, the switch 21 can stop the supply of the electric current from the electric current source unit 22 when turned off.

When A/D conversion is performed on a signal read from a pixel by using the comparison unit configured as described above, as in a timing chart illustrated in FIG. 2, a control signal for the switch 21 is kept high and the state of the switch 21 is maintained at an ON state while this A/D conversion is being performed (during an A/D conversion period). In other words, the electric current from the electric current source unit 22 is kept constant (electric current I). In the example in FIG. 2 where A/D conversion according to a correlated double sampling technique is performed, the electric current from the electric current source unit 22 is kept constant (electric current I) during an entire A/D conversion period of this correlated double sampling, including an autozero period (a time point t0 to a time point t1), a P-phase comparison period during which a reset signal read from the pixel and the reference signal are compared with each other (a time point t2 to a time point t3), and a D-phase comparison period during which a pixel signal read from the pixel and the reference signal are compared with each other (a time point t4 to a time point t5).

In recent years, lower electric power consumption has been required to be achieved in an electronic circuit formed on a semiconductor substrate or the like. In such a situation, for example, making the electric current I lower is considered for the purpose of suppressing an increase in electric power consumption of the comparison unit in FIG. 1. However, the electric current from the electric current source unit 22 and a response speed of the comparison unit has a trade-off relationship in such a comparison unit. Therefore, making this electric current I lower slows down a response from the comparison unit comparing the analog unit signal and the reference signal, causing a risk of the degradation of A/D conversion performance and, in particular, a high-speed characteristic in conversion processing.

Ensuring a high-speed A/D conversion has been required in recent years, while a margin in processing speed of the A/D conversion is not so large in most cases. Thus, it has been difficult to make the electric current I lower. In other words, suppressing an increase in electric power consumption has been difficult while the maintenance of a sufficient high-speed characteristic in the A/D conversion is aimed.

<Electric Current Control in Comparison Unit>

For a solution to this, the amount of electric current is configured to be controlled at the differential stage in the comparison unit that compares the signal levels of the plurality of signals such that, compared to the comparison period serving as a period during which this comparison unit compares the signal levels of the plurality of signals, the amount of electric current is reduced for a period other than this comparison period.

For example, a signal processing apparatus is configured to include a control unit that controls the amount of electric current at the differential stage in the comparison unit configured to compare the signal levels of the plurality of signals and, compared to the comparison period serving as a period during which this comparison unit compares the signal levels of the plurality of signals, reduces the amount of electric current for a period other than this comparison period.

With this configuration, the signal processing apparatus can suppress an increase in electric power consumption.

In addition, a plurality of pairs of the electric current source units each configured to supply the electric current and the switches each capable of disconnecting a path of the electric current from the electric current source unit, which pairs are interconnected in parallel, may be configured to be provided in the differential stage such that, by turning off the switch to disconnect the path of the electric current supplied by the electric current source unit for some of the plurality of pairs, the amount of electric current is reduced for the period other than the comparison period.

With this configuration, the amount of electric current from an electric current source for the period other than the comparison period can be reduced to less than that for the comparison period through such simple control as turning on/off the switch. That is, the amount of electric current can be controlled in a simpler manner. The amount of electric current can be also changed at a higher speed and accordingly, the amount of electric current can be controlled at a higher speed.

Meanwhile, the amount of electric current for the autozero period of the comparison unit may be configured to be reduced, compared to the comparison period. With this configuration, an output delay in the comparison unit can be reduced.

Additionally, the comparison unit may be configured to be further included. With this, the signal levels can be compared among the plurality of signals, while an increase in electric power consumption is suppressed. Furthermore, a counter may be configured to be included, which performs counting until a result of the comparison of the signal levels among the plurality of signals by this comparison unit changes. With this, the A/D conversion can be performed on the analog signal, while an increase in electric power consumption is suppressed.

Besides, in this case, the aforementioned plurality of signals may be configured to include a predetermined reference signal and a signal read from a unit pixel. With such a configuration, an increase in electric power consumption can be suppressed in a case where the A/D conversion is performed on a signal read from a pixel.

Furthermore, the comparison unit may be configured to perform the correlated double sampling during the A/D conversion. In addition, the reference signal and the reset signal read from the unit pixel may be configured to be compared with each other during a reset period of this correlated double sampling, while the reference signal and the pixel signal read from the unit pixel are compared with each other during a signal reading period of the correlated double sampling. Besides, compared to the comparison period during the reset period and the comparison period during the signal reading period, the amount of electric current for the period other than these comparison periods may be configured to be reduced. With this configuration, an increase in electric power consumption can be suppressed in the correlated double sampling.

<Image Sensor>

Figure 3:
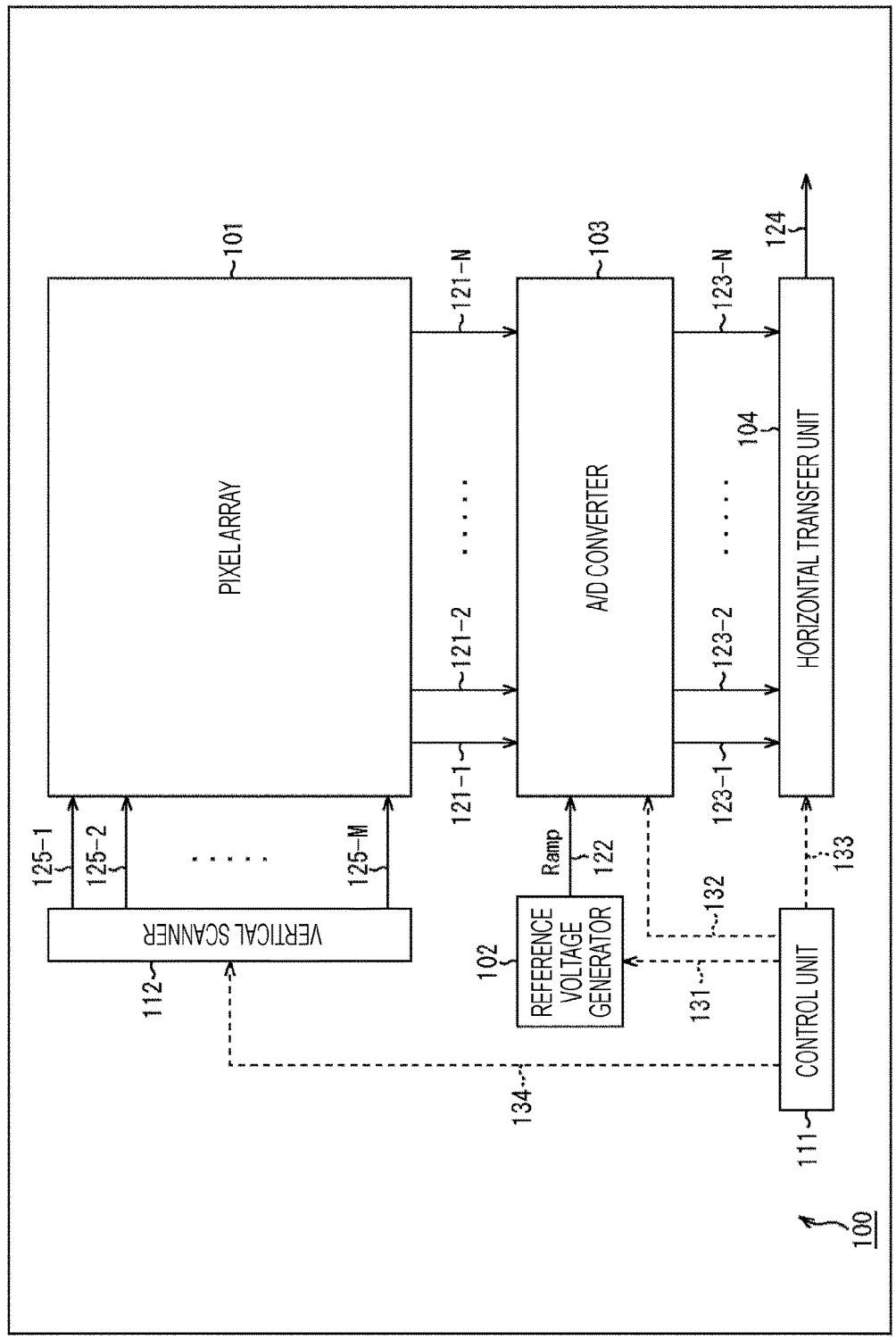
FIG. 3 is a diagram illustrating an exemplary main configuration of an image sensor.

FIG. 3 illustrates an exemplary main configuration of an image sensor serving as an embodiment of an image pickup element to which the present technology as described above is applied. The image sensor 100 illustrated in FIG. 3 is a device that performs photoelectric conversion on light from an object to output as image data. For example, the image sensor 100 is configured as a CMOS image sensor using a complementary metal oxide semiconductor (CMOS) or a CCD image sensor using a charge coupled device (CCD).

As illustrated in FIG. 3, the image sensor 100 includes a pixel array 101, a reference voltage generator 102, an A/D converter 103, a horizontal transfer unit 104, a control unit 111, and a vertical scanner 112.

The pixel array 101 is a pixel region in which pixel configurations (unit pixels) each having a photoelectric conversion element such as a photodiode are arranged in a flat surface shape or a curved surface shape. Although details of the configuration of the pixel array 101 will be described later, an analog signal read from the unit pixel is transmitted to the A/D converter 103 via any one of a vertical signal line 121-1 to a vertical signal line 121-N. Hereinafter, when it is not necessary to distinguish the vertical signal line 121-1 to the vertical signal line 121-N from one another in the description, they will be referred to as the vertical signal lines 121.

The reference voltage generator 102 generates the reference signal (also referred to as reference voltage) serving as a base signal for the A/D conversion by the A/D converter 103. Any waveform is used for this reference signal. For example, the reference signal may have a ramp wave (sawtooth wave). The following description will use a case where the ramp wave (Ramp) is used as the reference signal, as an example. The reference voltage generator 102 includes, for example, a D/A converter to produce the reference signal (Ramp) by using this D/A converter. This reference signal (Ramp) is supplied to the A/D converter 103 via a reference signal line 122.

The A/D converter 103 uses this reference signal to perform the A/D conversion on, for example, the analog signal transmitted from the pixel array 101 via the vertical signal line 121 (which has been read from each of the unit pixels) and then outputs the resultant digital data to the horizontal transfer unit 104 via any one of a signal line 123-1 to a signal line 123-N. Hereinafter, when it is not necessary to distinguish the signal line 123-1 to the signal line 123-N from one another in the description, they will be referred to as the signal lines 123.

The horizontal transfer unit 104 transfers the digital data supplied from the A/D converter 103 via the signal line 123 to, for example, the outside of the image sensor 100 via a signal line 124.

The control unit 111 controls the reference voltage generator 102 by supplying the control signal thereto via a control line 131. Additionally, the control unit 111 controls the A/D converter 103 as well by supplying the control signal thereto via a control line 132. Additionally, the control unit 111 controls the horizontal transfer unit 104 as well by supplying the control signal thereto via a control line 133. Additionally, the control unit 111 controls the vertical scanner 112 as well by supplying the control signal thereto via a control line 134. The control unit 111 controls the respective units in the image sensor 100 in this manner, thereby controlling an entire action of the image sensor 100 (actions of the respective units).

Note that, in FIG. 3, although each of the control line 131 to the control line 134 described above is depicted with one dotted line (dotted line arrow), each of these control lines may be constituted by a plurality of control lines.

The vertical scanner 112, under the control of the control unit 111, controls actions of transistors of the respective unit pixels in the pixel array 101 by supplying the control signals thereto via a control line 125-1 to a control line 125-M. Note that, hereinafter, when it is not necessary to distinguish the control line 125-1 to the control line 125-M from one another in the description, they will be referred to as the control lines 125.

<Pixel Array>

Figure 4:
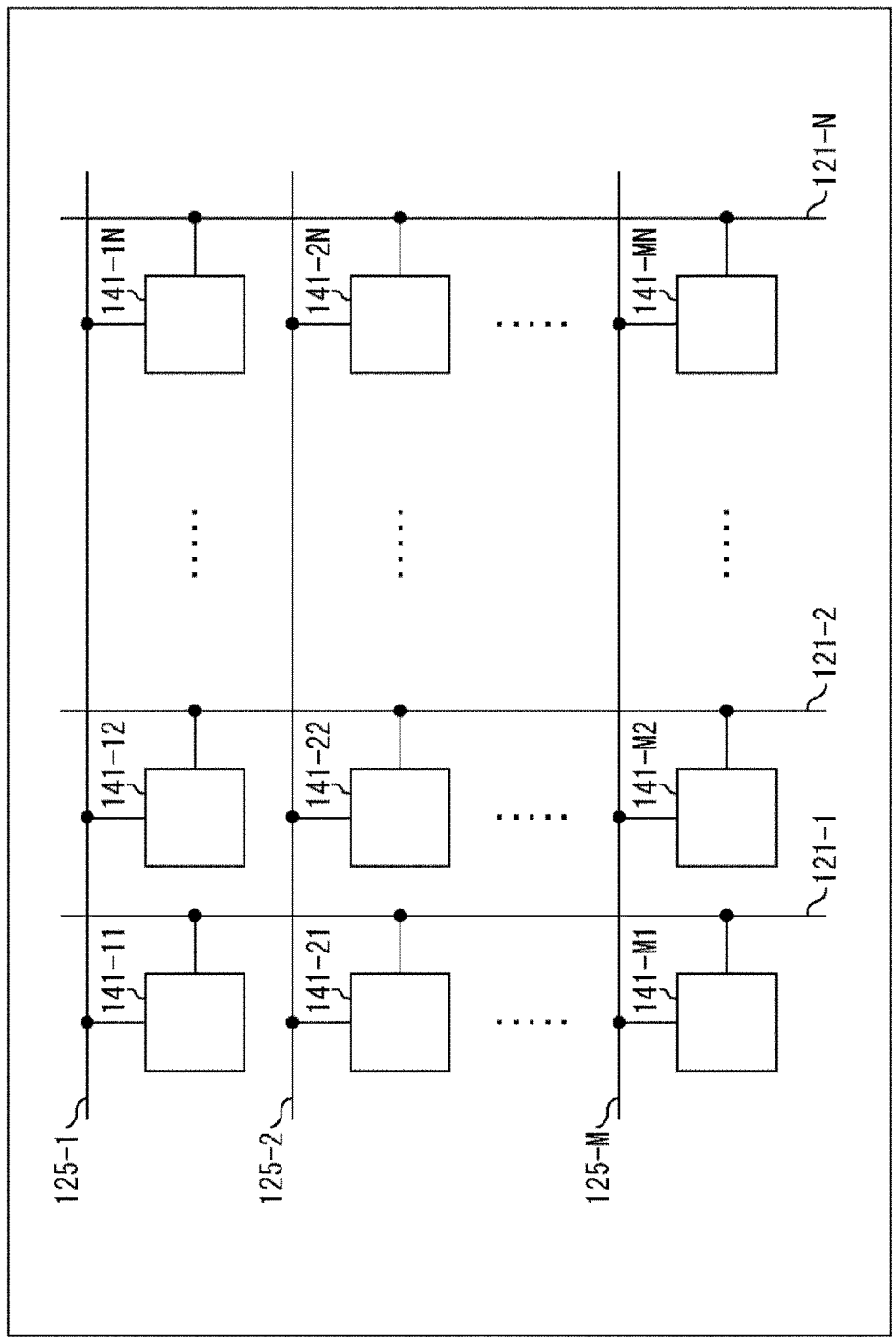
FIG. 4 is a diagram illustrating an exemplary main configuration of a pixel array.

FIG. 4 illustrates an exemplary main configuration of the pixel array 101. As described above, the plurality of unit pixels are arranged in a pixel region (pixel array 101) by being placed in order in a plane shape. In the case of the example in FIG. 4, M×N unit pixels 141 (a unit pixel 141-11 to a unit pixel 141-MN) are arranged by being placed in order in a matrix form (array form) with M number of rows and N number of columns (M and N represent arbitrary natural numbers). Hereinafter, when it is not necessary to distinguish the unit pixel 141-11 to the unit pixel 141-MN from one another in the description, they will be referred to as the unit pixels 141. Any arrangement is employed for the unit pixels 141 and, for example, an arrangement other than the matrix form may be employed, including a so-called honeycomb structure.

As illustrated in FIG. 4, the vertical signal lines 121 (the vertical signal line 121-1 to the vertical signal line 121-N) are formed for the respective columns of the unit pixels 141 (hereinafter, also referred to as unit pixel columns). Additionally, each one of the vertical signal lines 121 is connected to the respective unit pixels in the column (unit pixel column) corresponding to this particular one of the vertical signal lines 121 and transmits signals read from these respective unit pixels to the A/D converter 103. Meanwhile, as illustrated in FIG. 4, the control lines 125 (the control line 125-1 to the control line 125-M) are formed for the respective rows of the unit pixels 141 (hereinafter, also referred to as unit pixel rows). Additionally, each one of the control lines 125 is connected to the respective unit pixels in the unit pixel row corresponding to this particular one of the control lines 125 and transmits the control signal supplied from the vertical scanner 112 to the respective unit pixels.

In other words, the unit pixel 141 is connected to the vertical signal line 121 assigned to the column (unit pixel column) to which this unit pixel 141 belongs and the control line 125 assigned to the unit pixel row to which this unit pixel 141 belongs so as to drive on the basis of the control signal supplied via this particular control line 125 and supply an electrical signal obtained in this unit pixel 141 to the A/D converter 103 via this particular vertical signal line 121.

Note that, although the control line 125 for each row is depicted as one line in FIG. 4, a configuration may be employed in which the control line 125 for each row is constituted by a plurality of control lines.

<Unit Pixel Configuration>

Figure 5:
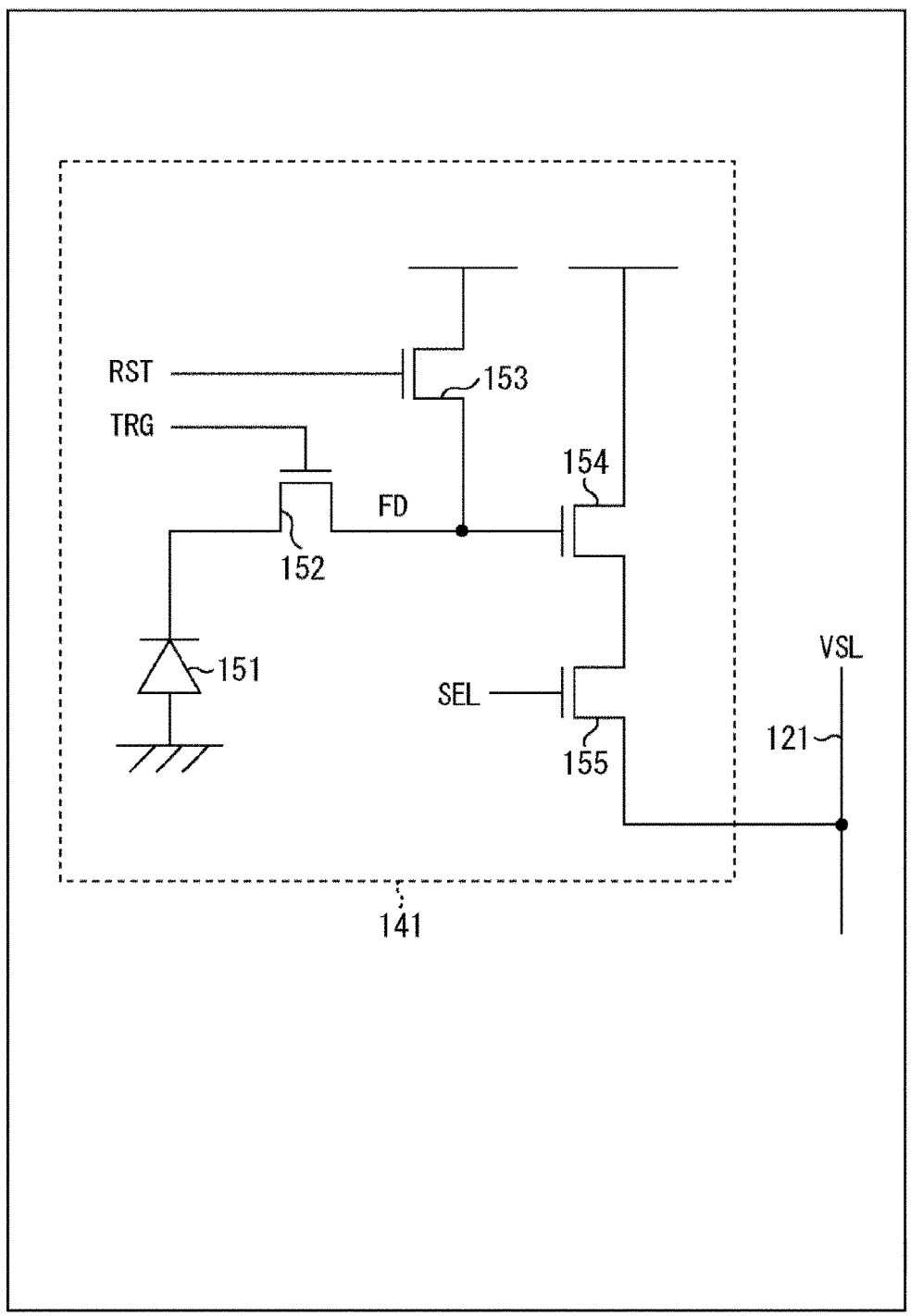
FIG. 5 is a diagram illustrating an exemplary main configuration of a unit pixel.

FIG. 5 is a diagram illustrating an exemplary main configuration of a circuit configuration of the unit pixel 141. As illustrated in FIG. 5, the unit pixel 141 includes a photodiode (PD) 151, a transfer transistor 152, a reset transistor 153, an amplifier transistor 154, and a select transistor 155.

The photodiode (PD) 151 photoelectrically converts received light to a photo-electric charge (a photoelectron in this case) having an electric charge amount in accordance with the intensity of this light and then accumulates the resultant photo-electric charge. This accumulated photo-electric charge is read at a predetermined timing. An anode electrode of the photodiode (PD) 151 is connected to ground in the pixel region (pixel ground), whereas a cathode electrode thereof is connected to floating diffusion (FD) via the transfer transistor 152. As a matter of course, a technique may be employed in which the cathode electrode of the photodiode (PD) 151 is connected to a power source in the pixel region (pixel power source) and the anode electrode thereof is connected to the floating diffusion (FD) via the transfer transistor 152 such that the photo-electric charge is read as a photohole.

The transfer transistor 152 controls reading of the photo-electric charge from the photodiode (PD) 151. As for the transfer transistor 152, a drain electrode is connected to the floating diffusion, whereas a source electrode is connected to the cathode electrode of the photodiode (PD) 151. In addition, a transfer control line (TRG) configured to transmit a transfer control signal supplied from the vertical scanner 112 is connected to a gate electrode of the transfer transistor 152. That is, this transfer control line (TRG) is included in the control line 125 in FIG. 4.

While a signal from the transfer control line (TRG) (i.e., the gate potential of the transfer transistor 152) is in an OFF state, the photo-electric charge is not transferred from the photodiode (PD) 151 (the photo-electric charge is accumulated in the photodiode (PD) 151). In contrast to this, while the signal from the transfer control line (TRG) is in the ON state, the photo-electric charge accumulated in the photodiode (PD) 151 is transferred to the floating diffusion (FD).

The reset transistor 153 resets an electric potential at the floating diffusion (FD). In the reset transistor 153, the drain electrode is connected to a power source potential, whereas the source electrode is connected to the floating diffusion (FD). In addition, a reset control line (RST) configured to transmit a reset control signal supplied from the vertical scanner 112 is connected to the gate electrode of the reset transistor 153. That is, this reset control line (RST) is included in the control line 125 in FIG. 4.

While a signal from the reset control line (RST) (i.e., the gate potential of the reset transistor 153) is in the OFF state, the floating diffusion (FD) is separated from the power source potential. In contrast to this, while the signal from the reset control line (RST) is in the ON state, an electric charge of the floating diffusion (FD) is thrown into the power source potential and the floating diffusion (FD) is reset.

The amplifier transistor 154 amplifies a potential change at the floating diffusion (FD) to output as an electrical signal (analog signal). In the amplifier transistor 154, the gate electrode is connected to the floating diffusion (FD), the drain electrode is connected to a source follower power source voltage, and the source electrode is connected to the drain electrode of the select transistor 155.

For example, the amplifier transistor 154 outputs the electric potential at the floating diffusion (FD) reset by the reset transistor 153 to the select transistor 155 as the reset signal (reset level). The amplifier transistor 154 also outputs the electric potential at the floating diffusion (FD) to which the photo-electric charge has been transferred by the transfer transistor 152, to the select transistor 155 as the pixel signal (light accumulation signal level).

The select transistor 155 controls the output of the electrical signal supplied from the amplifier transistor 154 to the vertical signal line (VSL) 121 (i.e., the A/D converter 103). In the select transistor 155, the drain electrode is connected to the source electrode of the amplifier transistor 154, whereas the source electrode is connected to the vertical signal line 121. In addition, a select control line (SEL) configured to transmit a select control signal supplied from the vertical scanner 112 is connected to the gate electrode of the select transistor 155. That is, this select control line (SEL) is included in the control line 125 in FIG. 3.

While a signal from the select control line (SEL) (i.e., the gate potential of the select transistor 155) is in the OFF state, the amplifier transistor 154 and the vertical signal line 121 are electrically separated from each other. Accordingly, the reset signal, the pixel signal and so on are not output from the corresponding unit pixel 141 in this state. In contrast to this, while the select control line (SEL) is in the ON state, the corresponding unit pixel 141 is being selected. In other words, the amplifier transistor 154 and the vertical signal line 121 are electrically connected to each other and a signal output from the amplifier transistor 154 is supplied to the vertical signal line 121 as the pixel signal from the corresponding unit pixel 141. As a consequence, the reset signal, the pixel signal and so on are read from the corresponding unit pixel 141.

<Configuration of A/D Converter>

Figure 6:
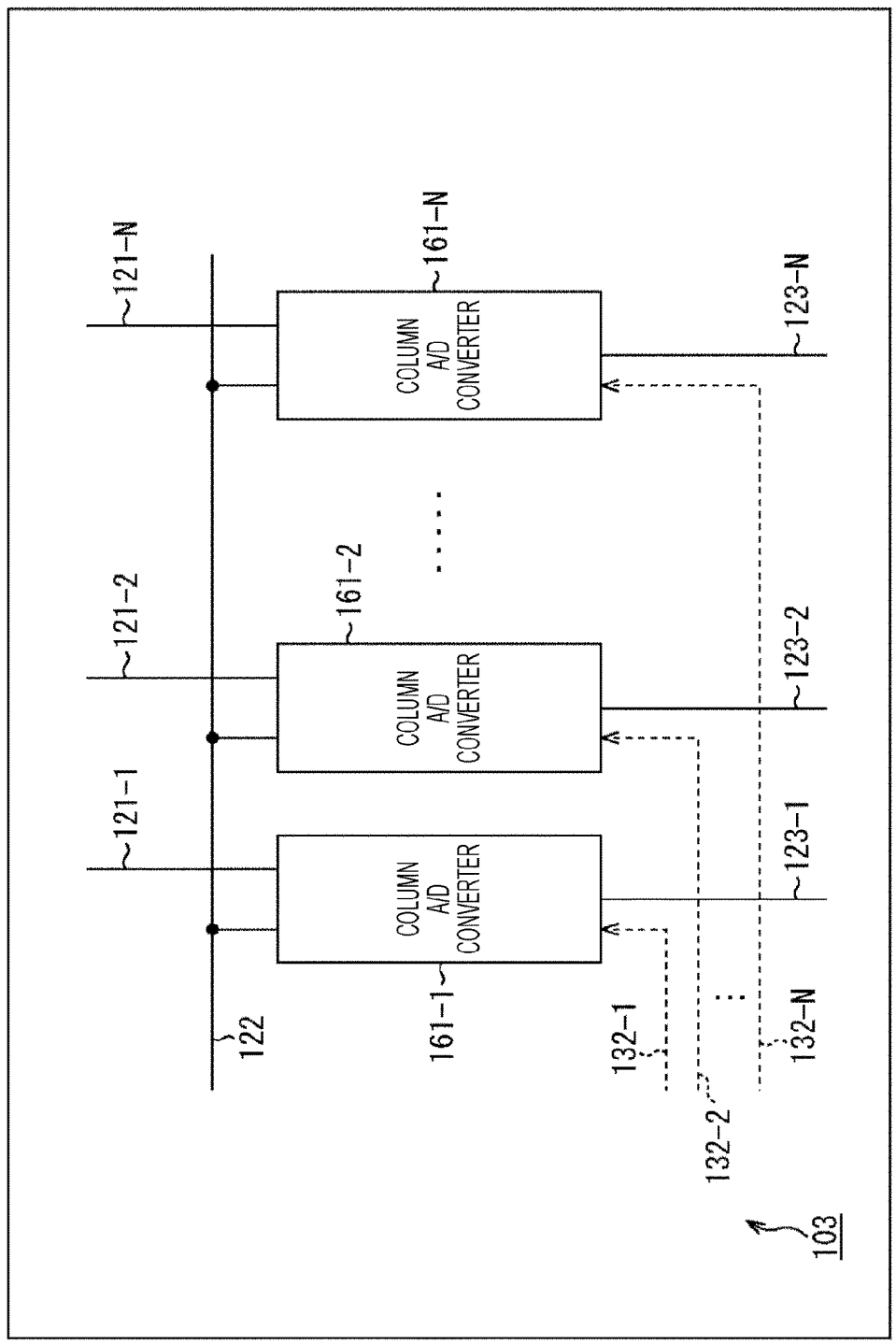
FIG. 6 is a diagram illustrating an exemplary main configuration of an A/D converter.

Next, an exemplary configuration of the A/D converter 103 (FIG. 3) will be described with reference to FIG. 6. As illustrated in FIG. 6, the A/D converter 103 includes a column A/D converter 161-1 to a column A/D converter 161-N. Hereinafter, when it is not necessary to distinguish the column A/D converter 161-1 to the column A/D converter 161-N from one another in the description, they will be referred to as the column A/D converters 161. The column A/D converter 161 is provided at each of the columns (unit pixel columns) in the pixel array 101.

Additionally, as illustrated in FIG. 5, the vertical signal lines 121 (the vertical signal line 121-1 to the vertical signal line 121-N) for the columns corresponding to the column A/D converters 161 (the column A/D converter 161-1 to the column A/D converter 161-N), respectively, and the reference signal line 122 are individually connected to the column A/D converters 161. The column A/D converter 161 performs the A/D conversion using a single-slope A/D conversion technique. Specifically, each one of the column A/D converters 161 performs the A/D conversion on a signal that has been read from the unit pixel 141 in the column corresponding to this particular one of the column A/D converters 161 and then supplied thereto via the vertical signal line 121 for this column, by way of the reference signal supplied from the reference voltage generator 102 via the reference signal line 122.

Meanwhile, as illustrated in FIG. 6, the signal lines 123 (the signal line 123-1 to the signal line 123-N) for the columns corresponding to the respective column A/D converters 161 are individually connected to the column A/D converter 161. Each one of the column A/D converters 161 supplies a result of the A/D conversion obtained at this particular one of the column A/D converters 161 to the horizontal transfer unit 104 via the signal line 123 corresponding to this particular one of the column A/D converters 161.

Furthermore, as illustrated in FIG. 6, the control lines 132 (the control line 132-1 to the control line 132-N) are individually connected to the column A/D converters 161. Each one of the column A/D converters 161 drives on the basis of the control signal supplied from the control unit 111 via the control line 132 corresponding to this particular one of the column A/D converters 161 (that is, under the control of the control unit 111).

<Configuration of Column A/D Converter>

Figure 7:
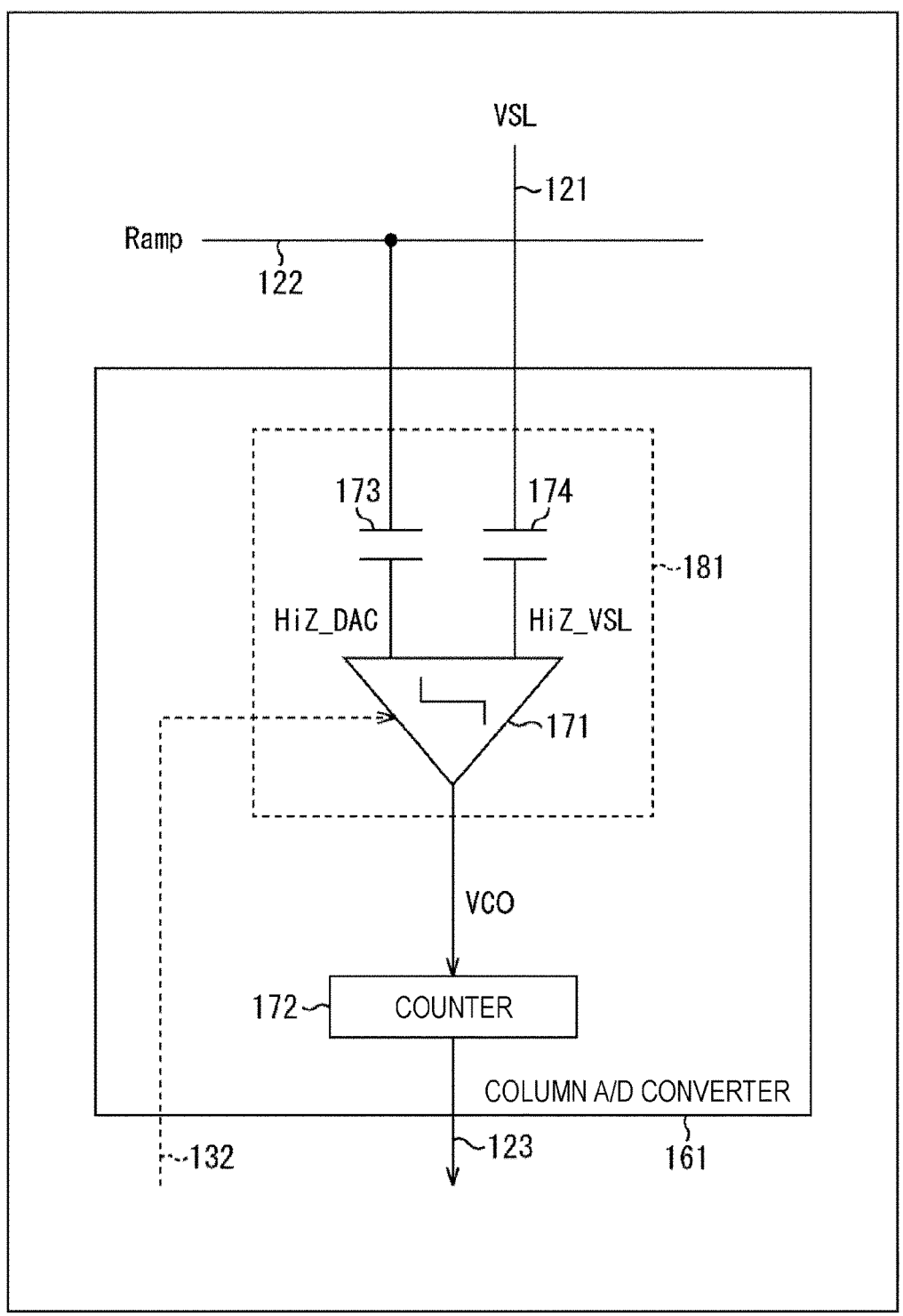
FIG. 7 is a diagram illustrating an exemplary main configuration of a column A/D converter.

Next, an exemplary configuration of the column A/D converter 161 (FIG. 6) will be described with reference to FIG. 7. As illustrated in FIG. 7, the column A/D converter 161 includes a comparison unit 171, a counter 172, a capacitor 173, and a capacitor 174.

In the comparison unit 171 having two inputs and one output, an input terminal HiZ VSL is connected to the vertical signal line 121 for the column corresponding to this particular comparison unit 171 via the capacitor 174, an input terminal HiZ DAC is connected to the reference signal line 122 via the capacitor 173, and an output terminal VCO is connected to the counter 172.

The comparison unit 171 compares an input signal input to the input terminal HiZ_VSL via the vertical signal line 121 and the capacitor 174 (e.g., the analog signal read from the unit pixel 141) and the reference signal input to the input terminal HiZ_DAC via the reference signal line 122 and the capacitor 173 with each other (compares the signal levels thereof) and then outputs a result of the comparison to the counter 172. Specifically, the comparison unit 171 outputs, from the output terminal VCO, a signal indicating which signal level is higher between the input signal and the reference signal, to supply to the counter 172.

This signal indicating the result of the comparison is, for example, one-bit digital data. For example, when the signal level of the reference signal (the signal input to the input terminal HiZ_DAC) is higher than the signal level of the input signal (the signal input to the input terminal HiZ_VSL), the value of the signal indicating this comparison result is obtained as "0". In the opposite case, the value thereof is obtained as "1". As a matter of course, these values of the signals may be obtained by using reverse setting. In addition, any bit length is used for the signal indicating the comparison result and information constituted by a plurality of bits may be employed.

In the counter 172, the input terminal is connected to the output terminal VCO of the comparison unit 171, whereas the output terminal is connected to the signal line 123 for the column corresponding to this particular counter 172. The comparison result is supplied to the counter 172 from the comparison unit 171. The counter 172 counts the number of clocks of clock signals until this comparison result is reversed (until the signal level at the output terminal VCO changes) since a counting start (that is, measures a time until the comparison result is reversed). Subsequently, at a time point when the comparison result is reversed, the counter 172 outputs a count value until then to the horizontal transfer unit 104 via the signal line 123 as a result of the A/D conversion of the input signal input to the input terminal HiZ VSL of the comparison unit 171 (namely, the digital data of the signal read from the unit pixel 141).

The capacitor 173 and the capacitor 174 are capacitors whose capacities are fixed (having predetermined capacities).

Note that, as illustrated in FIG. 7, the comparison unit 171, the capacitor 173, and the capacitor 174 may be integrated as a comparison unit 181 (the capacitor 173 and the capacitor 174 may be included into the configuration of the comparison unit).

As described above, the control unit 111 controls the comparison unit 181 (or the comparison unit 171). Specifically, the control unit 111 controls the amount of electric current at the differential stage in the comparison unit 181 to reduce the amount of electric current for the period other than the comparison period, compared to the comparison period. Additionally, in different words, it can be also said that the control unit 111 controls the column A/D converter 161 (the comparison unit 181 and the counter 172), the A/D converter 103, or the image sensor 100.

<Configuration of Comparison Unit>

Figure 8:
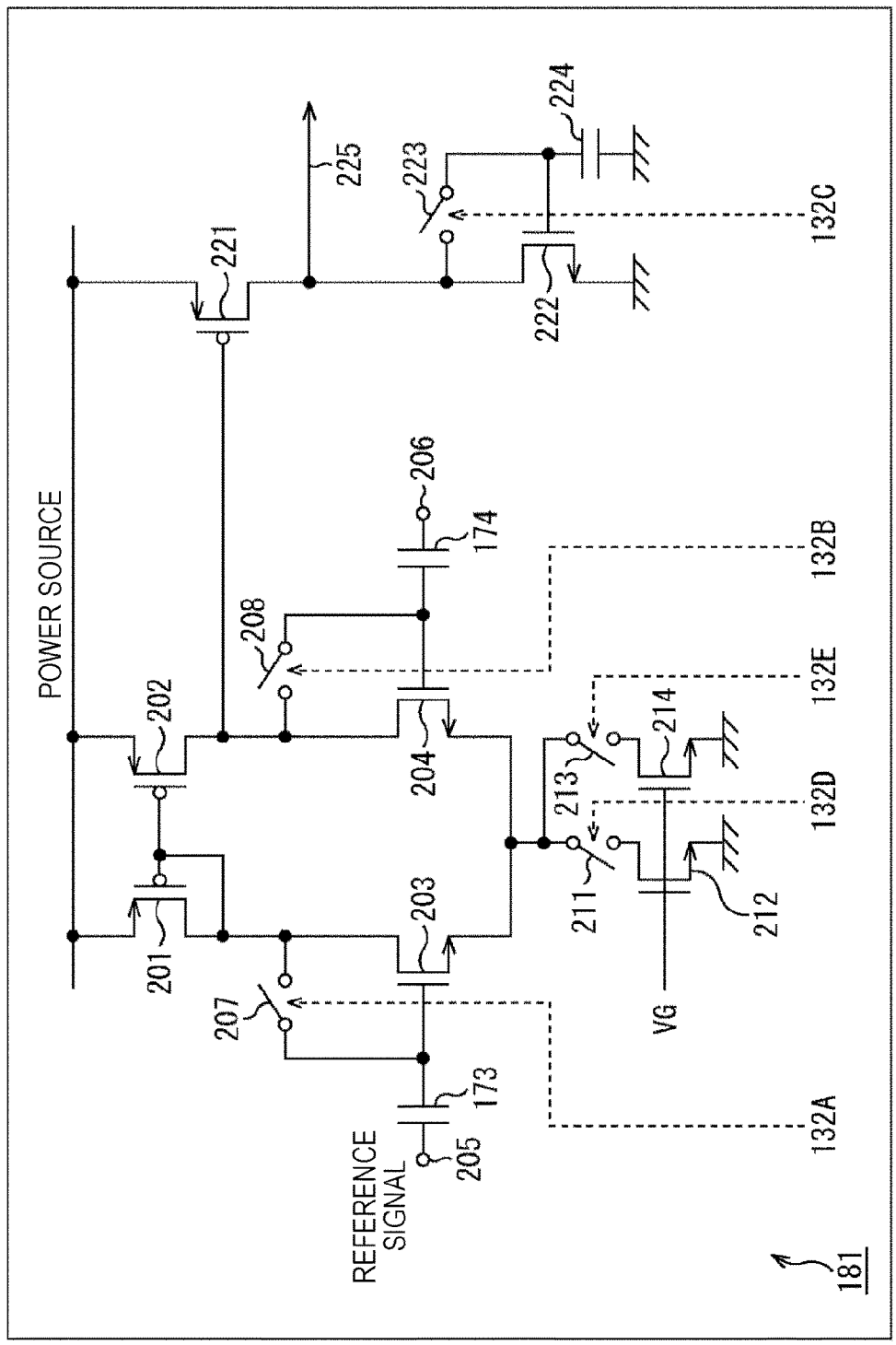
FIG. 8 is a diagram illustrating an exemplary main configuration of a comparison unit.

FIG. 8 illustrates an exemplary main configuration of the comparison unit 181. As illustrated in FIG. 8, the comparison unit 181 includes the differential stage illustrated on the left side of the drawing and the amplifier stage illustrated on the right side of the drawing. The comparison unit 181 includes, as the differential stage thereof, a transistor 201 and a transistor to a transistor 204, an input terminal 205 and an input terminal 206, a switch 207 and a switch 208, and the capacitor 173 and the capacitor 174. The comparison unit 181 also includes, as the differential stage thereof, a switch 211, an electric current source unit 212, a switch 213, and an electric current source unit 214. The comparison unit 181 further includes, as the amplifier stage thereof, a transistor 221, an electric current source unit 222, a switch 223, a capacitor 224, and an output terminal 225.

The transistor 201 and the transistor 202 are positive metal oxide semiconductor (PMOS) transistors serving as load transistors for differential amplification. A source of the transistor 201 is connected to a power source voltage (power source), a gate thereof is connected to a gate of the transistor 202, and a drain thereof is connected to a drain of the transistor 203. In addition, the gate and the drain of the transistor 201 are short-circuited. A source of the transistor 202 is connected to a power source voltage (power source), the gate thereof is connected to the gate of the transistor 201, and a drain thereof is connected to a drain of the transistor 204. The drain of the transistor 202 is also connected to the amplifier stage (a gate of the transistor 221).

The transistor 203 and the transistor 204 are negative metal oxide semiconductor (NMOS) transistors, each of which serves as an amplifier transistor configured to amplify a signal input from the input terminal. The drain of the transistor 203 is connected to the drain and the gate of the transistor 201, a gate thereof is connected to the input terminal 205 via the capacitor 173, and a source thereof is connected to the switch 211 and the switch 213 (also to a source of the transistor 204). The drain of the transistor 204 is connected to the drain of the transistor 202 and the amplifier stage (the gate of the transistor 221), a gate thereof is connected to the input terminal 206 via the capacitor 174, and the source thereof is connected to the switch 211 and the switch 213 (also to the source of the transistor 203).

The input terminal 205 is connected to the reference signal line 122 such that the reference signal is input thereto. The input terminal 206 is connected to the vertical signal line 121 such that the signals read from the unit pixel 141 (e.g., the reset signal and the pixel signal) are input thereto.

The switch 207 is provided between the drain and the gate of the transistor 203 so as to drive (be switched between a turned-on state and a turned-off state) when controlled by the control unit 111 (in line with the control signal supplied from the control unit 111 via a control line 132A). When this switch 207 is put into the ON state, the drain and the gate of the transistor 203 are short-circuited and then, autozero is performed. The switch 208 is provided between the drain and the gate of the transistor 204 so as to drive (be switched between a turned-on state and a turned-off state) when controlled by the control unit 111 (in line with the control signal supplied from the control unit 111 via a control line 132B). When this switch 208 is put into the ON state, the drain and the gate of the transistor 204 are short-circuited and then, the autozero is performed.

The switch 211 is connected in series with respect to the electric current source unit 212 so as to drive (be switched between a turned-on state and a turned-off state) when controlled by the control unit 111 (in line with the control signal supplied from the control unit 111 via a control line 132D). When this switch 211 is put into the ON state, a drain of the electric current source unit 212 and the sources of the transistor 203 and the transistor 204 are connected to one another and, when the switch 211 is put into the OFF state, the connection therebetween is canceled.

The electric current source unit 212 is an electric current source constituted by, for example, the transistor. The drain of the electric current source unit 212 is connected to the switch 211 and a source thereof is grounded. This electric current source unit 212 supplies, to the differential stage, the electric current in accordance with the electric potential (gate potential) VG supplied to a gate thereof while the switch 211 is in the ON state.

The switch 213 is connected in series with respect to the electric current source unit 214 so as to drive (be switched between a turned-on state and a turned-off state) when controlled by the control unit 111 (in line with the control signal supplied from the control unit 111 via a control line 132E). When this switch 213 is put into the ON state, a drain of the electric current source unit 214 and the sources of the transistor 203 and the transistor 204 are connected to one another and, when the switch 213 is put into the OFF state, the connection therebetween is canceled.

The electric current source unit 214 is an electric current source constituted by, for example, the transistor. The drain of the electric current source unit 214 is connected to the switch 213 and a source thereof is grounded. This electric current source unit 214 supplies, to the differential stage, the electric current in accordance with the electric potential (gate potential) VG supplied to a gate thereof while the switch 213 is in the ON state.

The transistor 221 at the amplifier stage is a PMOS transistor and amplifies a differential couple output voltage at the differential stage. A source of the transistor 221 is connected to a power source voltage (power source), the gate thereof is connected to the drain of the transistor 202 (differential couple output), and a drain thereof is connected to a drain of the electric current source unit 222 and the output terminal 225.

The electric current source unit 222 is an electric current source constituted by, for example, the NMOS transistor. The drain of the electric current source unit 222 is connected to the drain of the transistor 221, the switch 223, and the output terminal 225, a gate thereof is connected to the switch 223 and the capacitor 224, and a source thereof is grounded.

The switch 223 is provided between the drain and the gate of the electric current source unit 222. The switch 223 drives (is switched between a turned-on state and a turned-off state) when controlled by the control unit 111 (in line with the control signal supplied from the control unit 111 via a control line 132C). When this switch 223 is put into the ON state, the drain of the transistor 221, the drain of the electric current source unit 222, and the output terminal 225 are connected to one another, while the gate of the electric current source unit 222 and the capacitor 224 are connected to each other. When the switch 223 is put into the OFF state, the connection therebetween is canceled.

In the capacitor 224, one end is connected to the gate of the electric current source unit 222 and the switch 223, whereas another end is grounded.

As illustrated in FIG. 8, a pair of the switch 211 and the electric current source unit 212 and a pair of the switch 213 and the electric current source unit 214 are configured to be in parallel to each other.

<Reduction in Amount of Electric Current for Period other than Comparison Period>

The control unit 111 controls the comparison unit 181 (the switch 207, the switch 208, the switch 211, the switch 213, and the switch 223) by supplying the control signals thereto via the control lines 132 (the control line 132A to the control line 132E). For example, the column A/D converter 161 is assumed to perform the A/D conversion according to the correlated double sampling (CDS). While this column A/D converter 161 is performing the A/D conversion on the signal read from the unit pixel 141 (A/D conversion period), the control unit 111 controls the comparison unit 181 as in a timing chart illustrated in FIG. 9.

In the correlated double sampling, the reset signal is read from the unit pixel 141 during the reset period such that the A/D conversion is performed thereon (so as to be compared with the reference signal), whereas the pixel signal is read from the unit pixel 141 during the signal reading period such that the A/D conversion is performed thereon (so as to be compared with the reference signal). Specifically, the comparison unit 181 compares the signal levels between the reset signal read from the unit pixel 141 and the reference signal during a period from a time point t2 to a time point t3 (P-phase comparison period) within the A/D conversion period illustrated in FIG. 9, while comparing the pixel signal read from the unit pixel 141 and the reference signal with each other during a period from a time point t4 to a time point t5 (D-phase comparison period) therewithin. That is, the comparison unit 181 has the P-phase comparison period and the D-phase comparison period as the comparison periods for comparing the signals.

Figure 2:
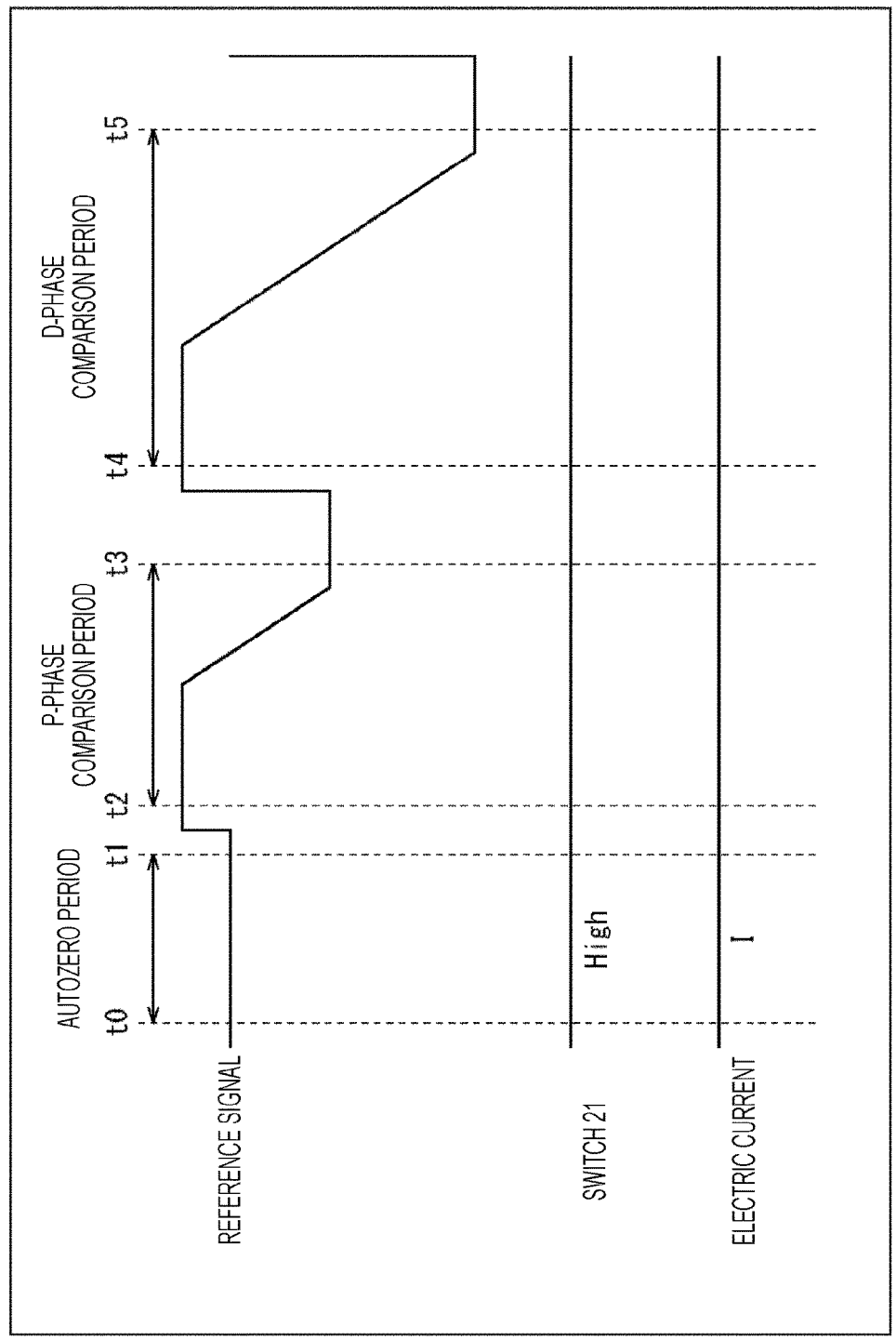
FIG. 2 is a timing chart for explaining an example of how comparison proceeds.

During such an A/D conversion period, as in the case of the switch 21 in FIG. 2, the control unit 111 keeps the value of the control signal to supply via the control line 132D at "H (High)" in order to keep the switch 211 in the ON state. In addition, the control unit 111 sets the value of the control signal to supply via the control line 132E to "H" to put the switch 213 into the ON state during the comparison periods (the P-phase comparison period and the D-phase comparison period), while setting the value of the control signal to supply via the control line 132E to "L (Low)" to put the switch 213 into the OFF state during the period other than these comparison periods. With this setting, the electric current source unit 212 and the electric current source unit 214 are configured to supply the electric currents during the comparison periods, while the electric current source unit 212 is configured to supply the electric current during the period other than the comparison periods.

Figure 9:
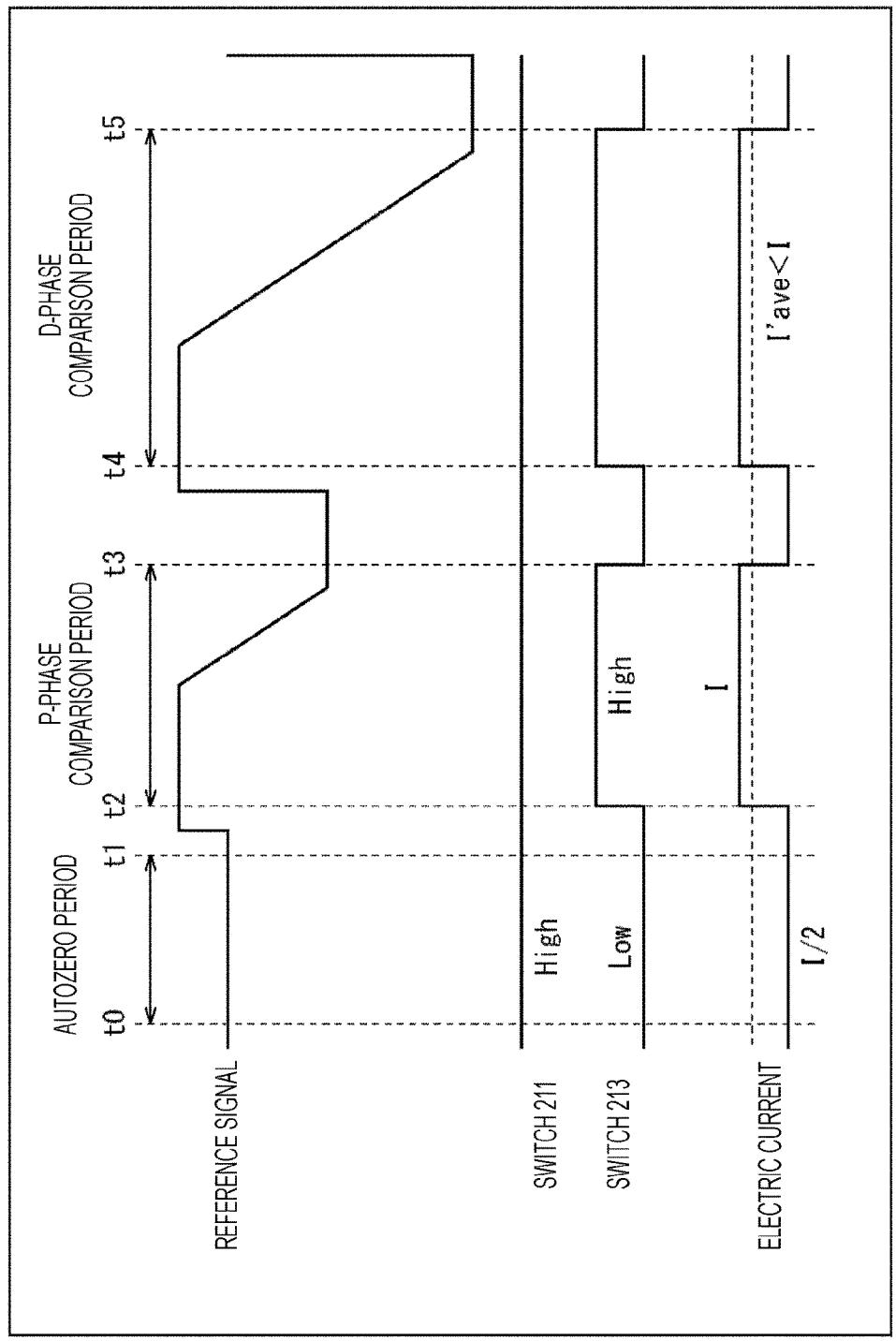
FIG. 9 is a timing chart for explaining an example of how comparison proceeds.

Accordingly, when it is assumed that the same transistor size is employed for both of the electric current source unit 212 and the electric current source unit 214, the amount of electric currents supplied by the electric current source unit 212 and the electric current source unit 214 during the period other than the comparison periods becomes half the amount of electric current I for the comparison periods (I/2), as illustrated in FIG. 9. In other words, the control unit 111 controls such that the amount of electric current is reduced during a period where a slower response speed is allowable (the period other than the comparison periods), while avoiding the reduction in the amount of electric current during the comparison periods where a sufficient response speed is required.

By carrying out such control, an average of the amount of electric currents supplied by the electric current source unit 212 and the electric current source unit 214 during the A/D conversion period (I'ave) is made smaller than the amount of electric current I for the case where the switch 211 and the switch 213 are kept in the ON state (I'ave<I). Consequently, the control unit 111 is able to suppress an increase in the amount of electric power consumption of the comparison unit 181, while substantially avoiding the reduction in the response speed of the comparison unit 181.

<Reduction in Amount of Electric Current for Autozero Period>

Additionally, when the control unit 111 reduces the amount of electric current for the autozero period where the comparison unit 181 performs the autozero (from the time point t1 to the time point t2) compared to the comparison period, an output delay in the comparison unit 181 is reduced, while the response speed thereof can be enhanced. The description thereof will be given with reference to FIG. 10 to FIG. 14.

Figure 10:
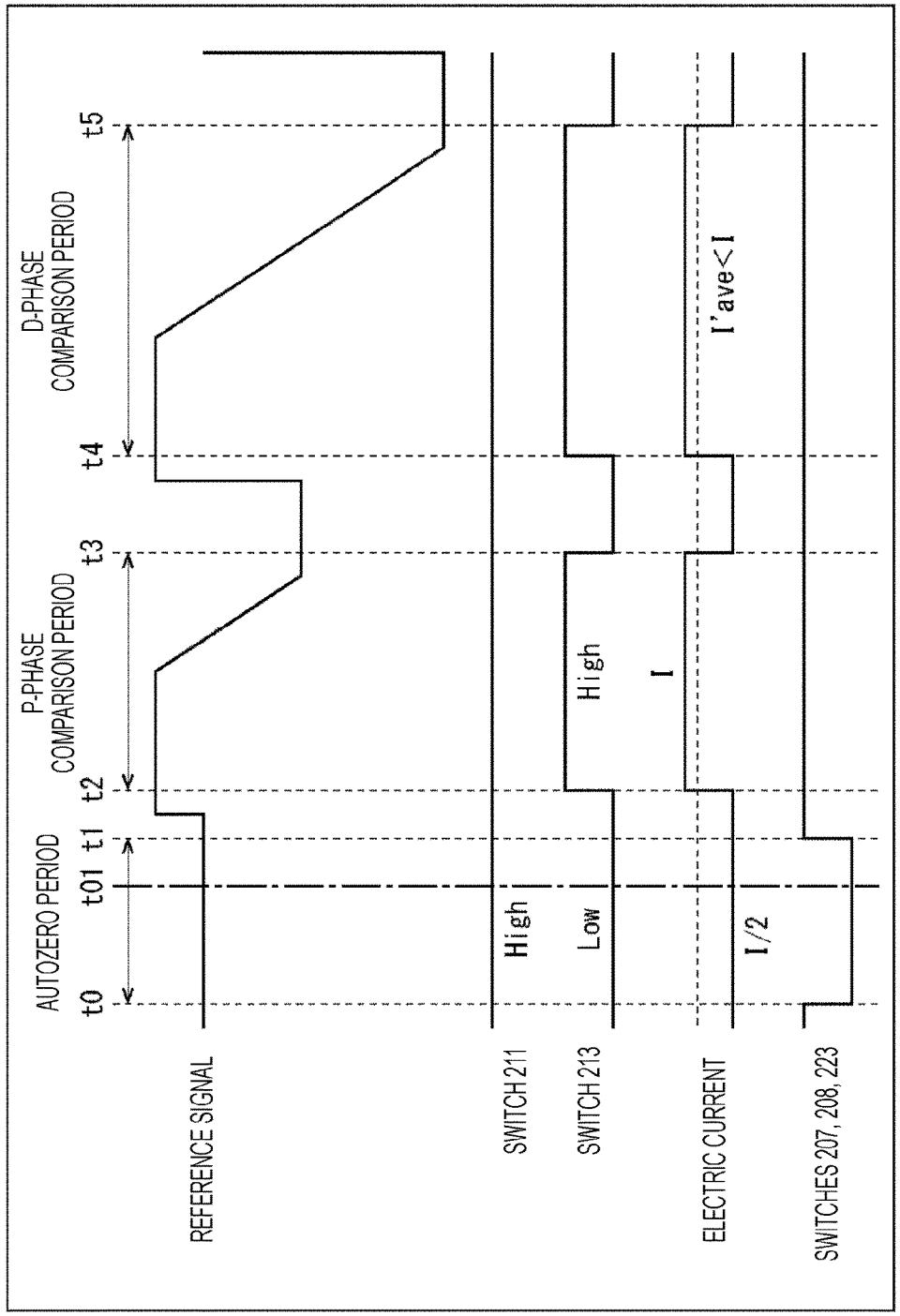
FIG. 10 is a diagram for explaining an example of how comparison proceeds.
Figure 11:
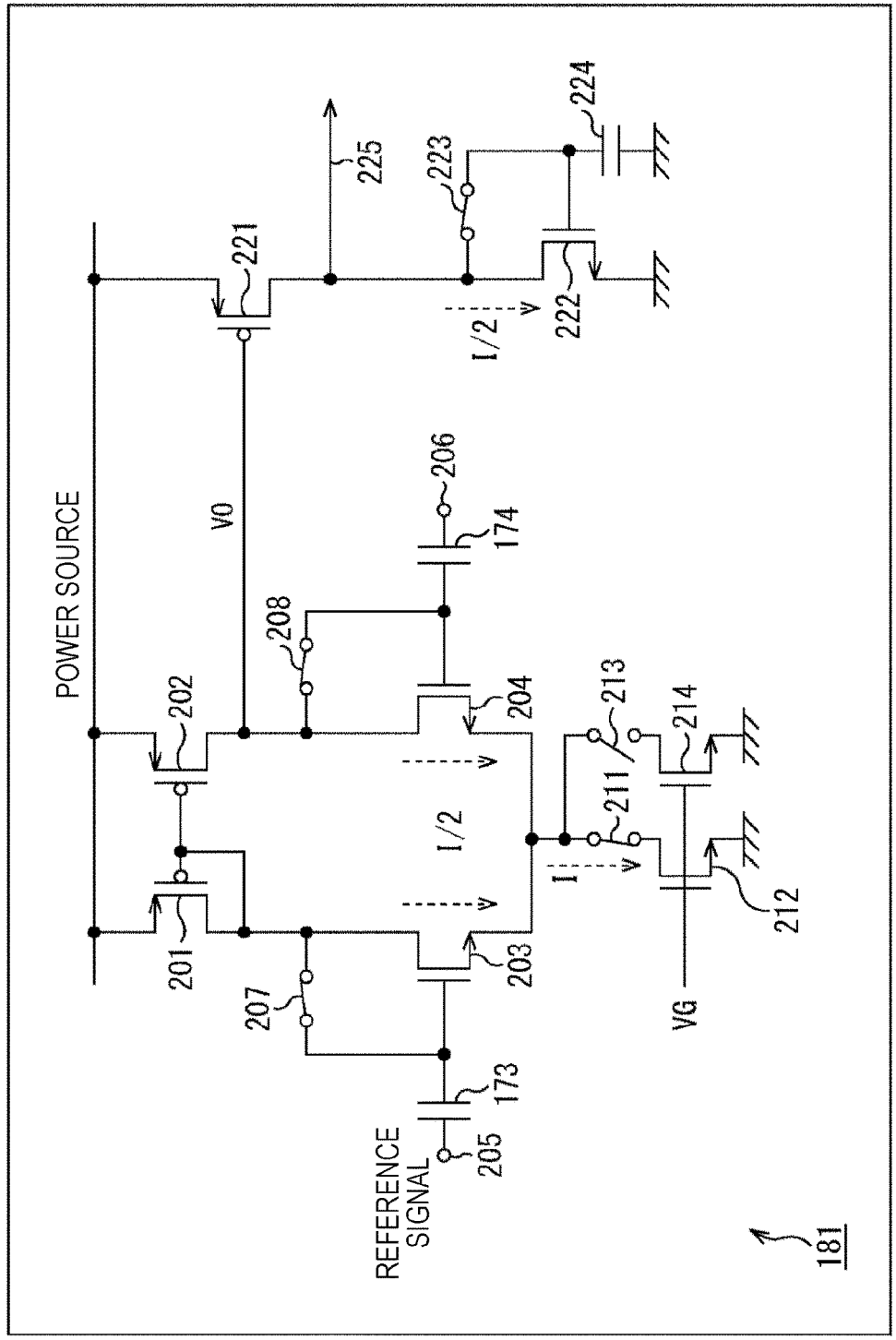
FIG. 11 is a diagram for explaining an example of how comparison proceeds.

FIG. 11 illustrates a state of the comparison unit 181 during the autozero period (for example, at a time point t01 illustrated in FIG. 10). In a state in FIG. 11, the switch 207, the switch 208, and the switch 223 are in the ON state (the values of the control signals supplied by the control unit 111 via the control line 132A to the control line 132C are "L").

In this state, the control unit 111 supplies the control signal having the value "H" via the control line 132D to put the switch 211 into the ON state and also supplies the control signal having the value "L" via the control line 132E to put the switch 213 into the OFF state. When the electric current I is assumed to flow through the electric current source unit 212, an electric current of I/2 flows into each member of the differential unit.

When the transistor 201 to the transistor 204 have the same sizes with each other, the electric current is mirrored and thus, the electric current I/2 flows into the electric current source unit 222. The differential couple output voltage in this state (the gate potential of the transistor 221) is assumed as V0.

Figure 12:
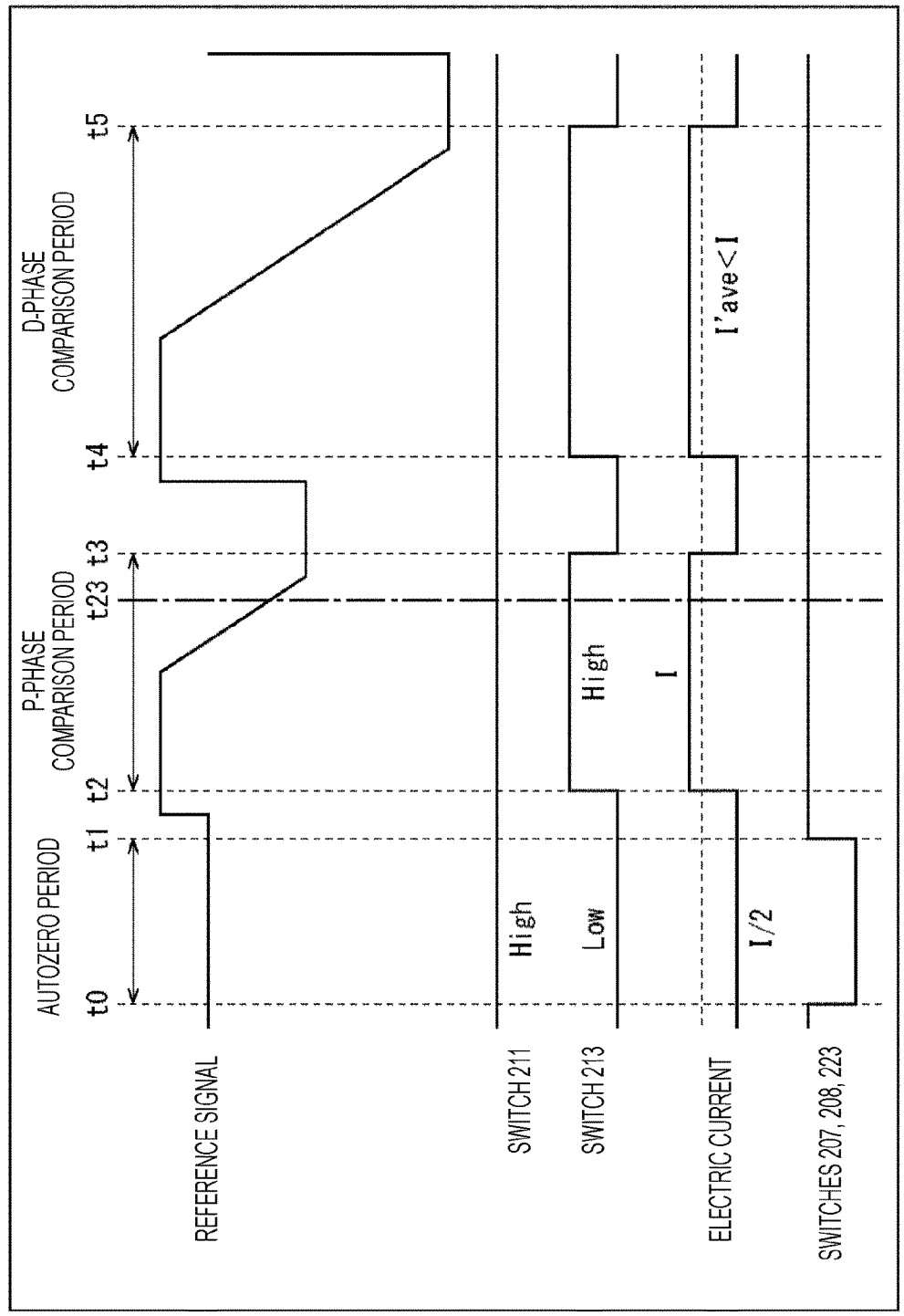
FIG. 12 is a diagram for explaining an example of how comparison proceeds.
Figure 13:
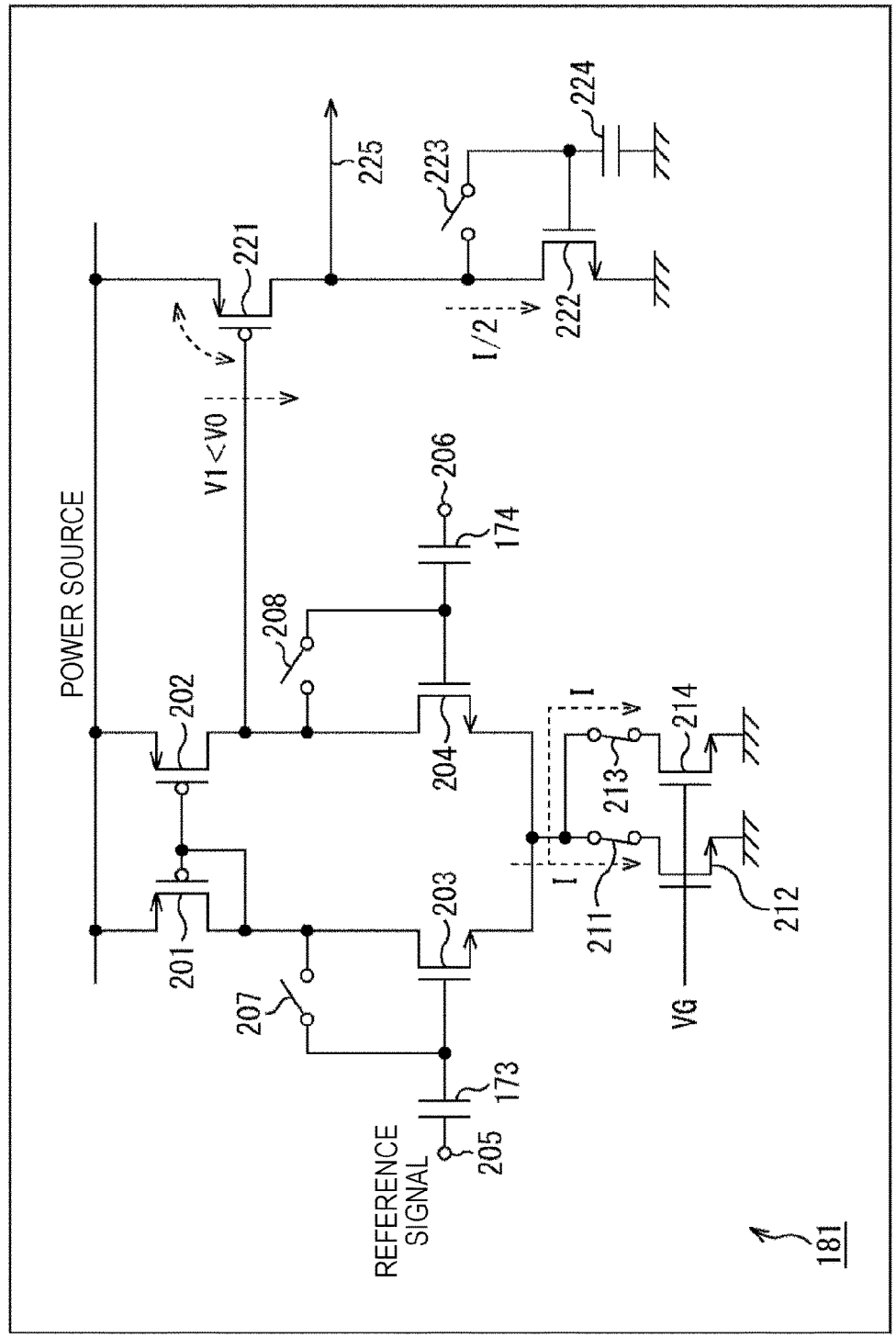
FIG. 13 is a diagram for explaining an example of how comparison proceeds.

In comparison to this, FIG. 13 illustrates a state of the comparison unit 181 during the comparison period (for example, at a time point t23 illustrated in FIG. 12). In a state in FIG. 13, the switch 207, the switch 208, and the switch 223 are in the OFF state (the values of the control signals supplied by the control unit 111 via the control line 132A to the control line 132C are "H").

In this state, the control unit 111 supplies the control signal having the value "H" via the control line 132D to put the switch 211 into the ON state and also supplies the control signal having the value "H" via the control line 132E to put the switch 213 into the ON state. When the electric current I is assumed to flow through both of the electric current source unit 212 and the electric current source unit 214, the electric current flowing through the differential unit naturally increases more than that in the state in FIG. 11. Accordingly, a differential couple output voltage V1 in this state decreases less than V0 (V1<V0). When the differential couple output voltage decreases, a voltage Vgs between the source and the gate of the transistor 221 becomes higher and, from an effect according to that, it is made easier for an output signal (the electric potential at the output terminal 225) to be reversed in action. With this, the output delay in the comparison unit 181 is reduced, while the response speed thereof can be enhanced.

Figure 14:
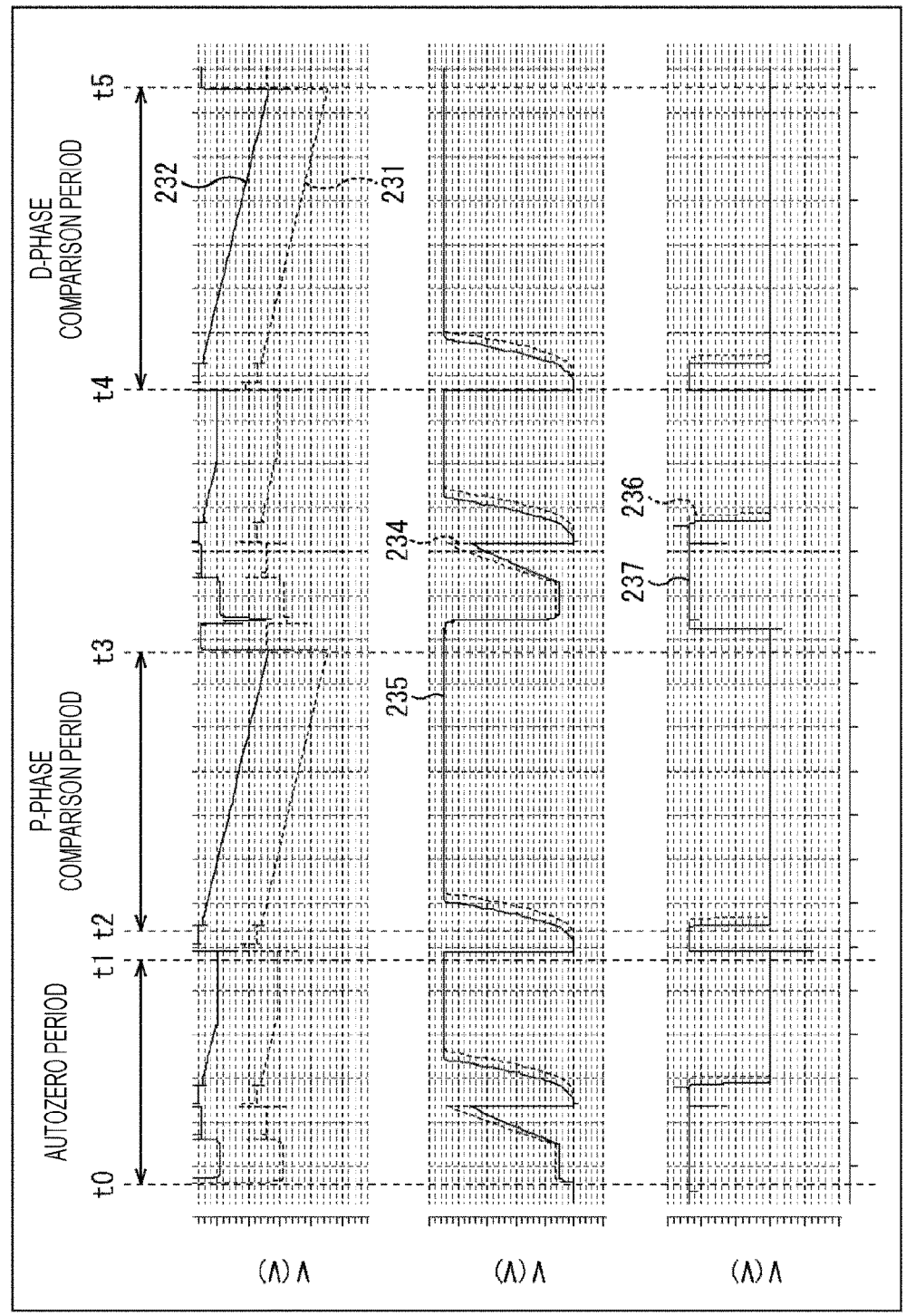
FIG. 14 is a timing chart for explaining an example of what comparison results are obtained.

FIG. 14 illustrates an example of how the signals behave during the A/D conversion period. A graph in the topmost part of FIG. 14 illustrates an example of the reference signal input to the comparison unit 181. A dotted line 231 in this graph illustrates an example of the reference signal in a case where the switch 211 and the switch 213 are kept in the ON state during the A/D conversion period. Meanwhile, a solid line 232 illustrates an example of the reference signal in a case where the switch 213 is put into the OFF state during the autozero period.

A graph in the center part of FIG. 14 illustrates an example of the output signal from the comparison unit 181. A dotted line 234 in this graph illustrates an example of the output signal in a case where the switch 211 and the switch 213 are kept in the ON state during the A/D conversion period. Meanwhile, a solid line 235 illustrates an example of the output signal in a case where the switch 213 is put into the OFF state during the autozero period.

A graph in the lowest part of FIG. 14 illustrates an example of the output signal from the comparison unit 181 whose waveform is additionally shaped. A dotted line 236 in this graph illustrates an example of the output signal indicated by the dotted line 234 after the waveform thereof is shaped. Meanwhile, a solid line 237 illustrates an example of the output signal indicated by the solid line 235 after the waveform thereof is shaped.

As illustrated in the graph in the center part of FIG. 14, the output signal responds at a higher speed in a case where the switch 213 is put into the OFF state during the autozero period (solid line 235) than the case where the switch 211 and the switch 213 are kept in the ON state during the A/D conversion period (dotted line 234). The same applies to the case after the waveform is shaped (the solid line 237 and the dotted line 236).

As described above, when the amount of electric current is reduced during the autozero period less than that during the comparison period, the output delay in the comparison unit 181 is reduced, while the response speed thereof can be enhanced.

<Flow of Control Processing>

Figure 15:
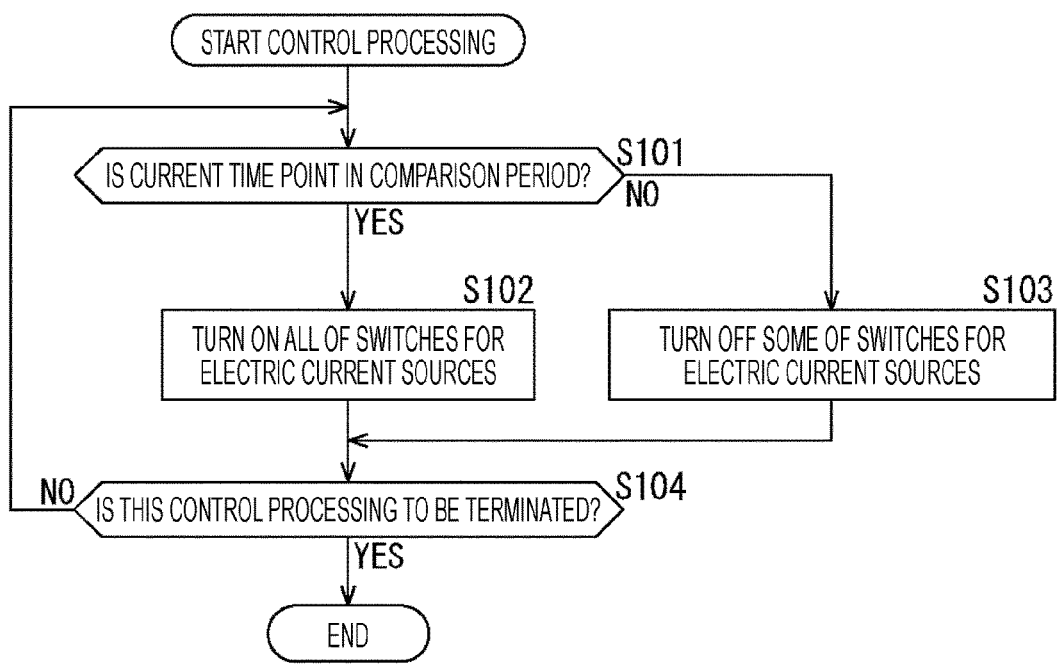
FIG. 15 is a flowchart for explaining an exemplary flow of control processing.

An exemplary flow of control processing carried out by the control unit 111 configured to carry out the control as described thus far will be described with reference to a flowchart in FIG. 15.

Once the control processing is started, the control unit 111 judges, at step S101, whether the current time point is in the comparison period (for example, the P-phase comparison period or the D-phase comparison period). When it is judged that the current time point is in the comparison period, the processing proceeds to step S102.

At step S102, the control unit 111 supplies the control signal to put all of the switches for electric current sources used to control the amount of electric current supplied by the electric current source units (the switch 211 and the switch 213 in the case of the example in FIG. 8) into the ON state. After this processing is completed, the processing proceeds to step S104.

Meanwhile, when it is judged at step S101 that the current time point is not in the comparison period, the processing proceeds to step S103. At step S103, the control unit 111 supplies the control signal to put some of the switches for electric current sources (the switch 213 in the case of the example in FIG. 8) into the OFF state. After this processing is completed, the processing proceeds to step S104.

At step S104, the control unit 111 judges whether this control processing is to be terminated. When it is judged that the control processing is not to be terminated because the comparison of the signal levels (namely, the A/D conversion) by the comparison unit 181 continues, the processing returns to step S101 and the processing subsequent thereto is repeated.

When it is judged at step S104 that the control processing is to be terminated because the comparison of the signal levels (namely, the A/D conversion) by the comparison unit 181 is completed, the control processing is terminated.

By carrying out the control processing as described above, the control unit 111 can suppress an increase in electric power consumption of the comparison unit 181.

<Another Exemplary Configuration of Comparison Unit>

The above description has dealt with a case where two pairs of the electric current source units (the electric current source unit 212 and the electric current source unit 214) and the switches (the switch 211 and the switch 213), in each pair of which the electric current source unit and the switch are connected in series, are provided at the differential stage in the comparison unit 181 such that these two pairs are arranged in parallel to each other. However, any configuration is employed for the comparison unit 181 as long as the amount of electric current can be controlled by the control unit 111 controlling the switch and the configuration thereof is not limited to this example.

For example, any transistor sizes are employed for the respective electric current source units and the same transistor size may not be used therebetween. That is, the amounts of electric currents supplied by the respective electric current source units are freely set and the same amount of electric current may not be used therebetween. In addition, a plural number of the pairs of the switches and the electric current source units, which pairs are arranged in parallel to each other, is only required and three or more pairs may be employed. In addition, the number of the switches and the number of the electric current source units may not have a one-to-one relationship, while the switch and the electric current source unit may not be connected in series to each other. For example, a single switch may be configured so as to be able to disconnect the paths of the electric currents from the plurality of electric current source units. Besides, these pairs may not be connected in parallel to one another, while a configuration other than the pair of the switch and the electric current source unit may be additionally provided. In short, a more complicated configuration is also possible.

Meanwhile, the configuration of part other than the switch 211, the electric current source unit 212, the switch 213, and the electric current source unit 214 is also freely set and not limited to the aforementioned example (the configuration in FIG. 8 and so on). Naturally, the respective members including the column A/D converter 161, the A/D converter 103, and the image sensor 100 are also freely configured in addition to the case of the comparison unit 181.

2. <Second Embodiment>
<Another Configuration of Comparison Unit>

Note that the control method for the amount of electric current from the electric current source unit is not limited to the one described above in the first embodiment, specifically, the control using the switch. For example, the amount of electric current for the period other than the comparison period may be reduced less than that during the comparison period by causing the gate potential at the electric current source unit to decrease.

Figure 16:
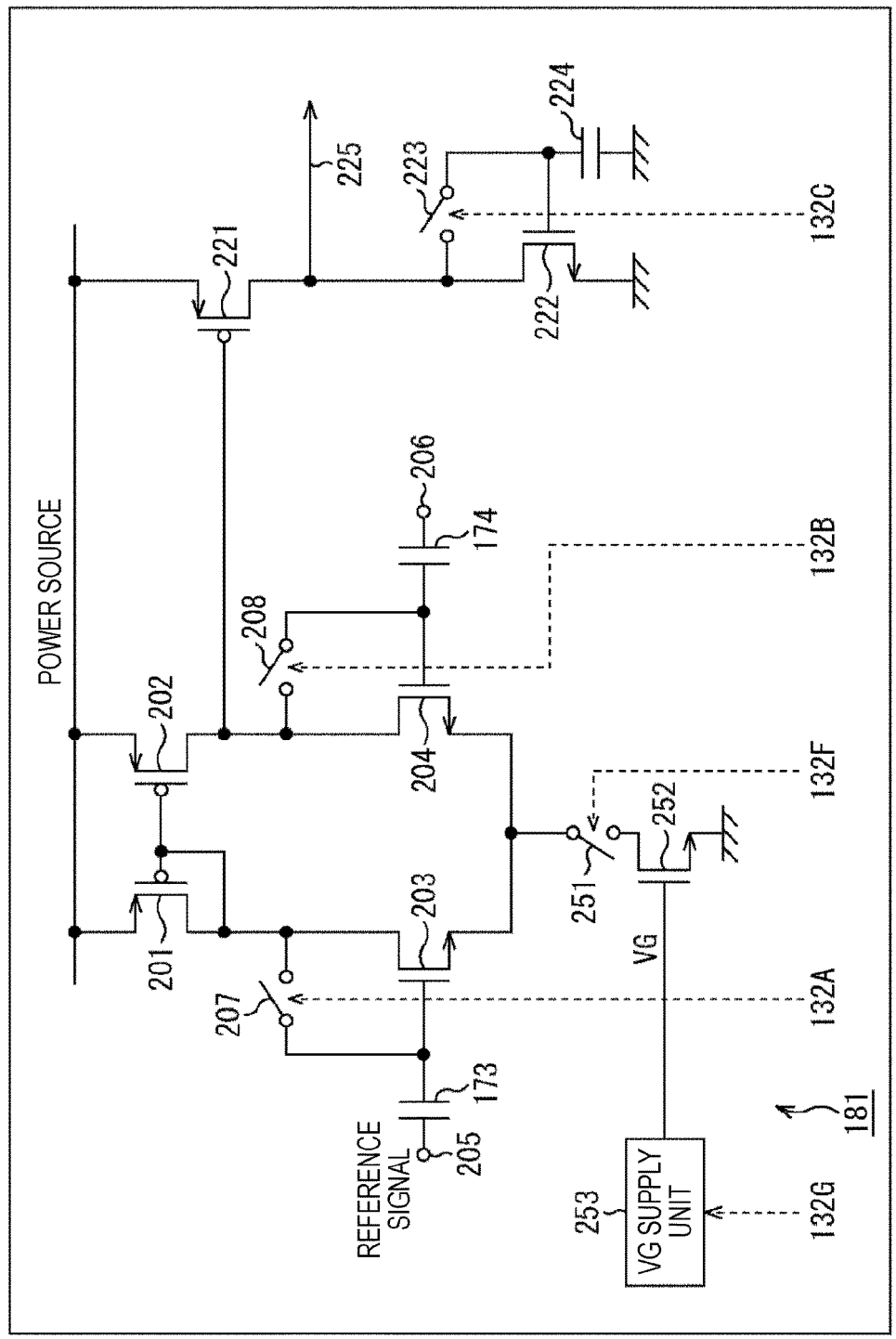
FIG. 16 is a diagram illustrating another exemplary configuration of a comparison unit.

FIG. 16 is a diagram illustrating an exemplary main configuration of a comparison unit 181 in such a case. In the example in FIG. 16, the comparison unit 181 includes a switch 251 and an electric current source unit 252 instead of the switch 211, the electric current source unit 212, the switch 213, and the electric current source unit 214 in the example in FIG. 8.

The switch 251 is connected in series with respect to the electric current source unit 252 so as to drive (be switched between a turned-on state and a turned-off state) when controlled by a control unit 111 (in line with the control signal supplied from the control unit 111 via a control line 132F). When this switch 251 is put into the ON state, a drain of the electric current source unit 252 and sources of a transistor 203 and a transistor 204 are connected to one another and, when the switch 251 is put into the OFF state, the connection therebetween is canceled.

The electric current source unit 252 is an electric current source constituted by, for example, the transistor. The drain of the electric current source unit 252 is connected to the switch 251 and a source thereof is grounded. This electric current source unit 252 supplies, to the differential stage, the electric current in accordance with the electric potential (gate potential) VG supplied to a gate thereof while the switch 251 is in the ON state.

In short, in the case of the example in FIG. 16, the comparison unit 181 includes one pair of the switch and the electric current source unit. In this case, a VG supply unit 253 is additionally provided. This VG supply unit 253 may be provided within the comparison unit 181, may be provided within a column A/D converter 161, may be provided within an A/D converter 103, may be provided within an image sensor 100, or may be provided at the outside of the image sensor 100.

The VG supply unit 253 supplies the gate potential VG to the electric current source unit 252. That is, the VG supply unit 253 is capable of controlling the amount of electric current from the electric current source unit 252. The gate potential VG supplied by this VG supply unit 253 is controlled by the control unit 111. Specifically, the VG supply unit 253 supplies the gate potential VG in line with the control signal supplied from the control unit 111 via a control line 132G. In other words, the control unit 111 controls the amount of electric current from the electric current source unit 252 by controlling the VG supply unit 253 (gate potential VG).

<Reduction in Amount of Electric Current for Period other than Comparison Period>

For example, the column A/D converter 161 is assumed to perform the A/D conversion according to the correlated double sampling (CDS). While this column A/D converter 161 is performing the A/D conversion on the signal read from a unit pixel 141 (A/D conversion period), the control unit 111 controls the comparison unit 181 as in a timing chart illustrated in FIG. 17.

Specifically, as in the case of the switch 21 in FIG. 2, the control unit 111 keeps the value of the control signal to supply via the control line 132F at "H (High)" in order to keep the switch 251 in the ON state. The control unit 111 also controls the VG supply unit 253 to set the gate potential VG at the electric current source unit 252 to a predetermined high electric potential during the comparison periods (the P-phase comparison period and the D-phase comparison period) and set the gate potential VG at the electric current source unit 252 to a predetermined low electric potential (an electric potential less than that during the comparison periods) during the period other than these comparison periods.

Figure 17:
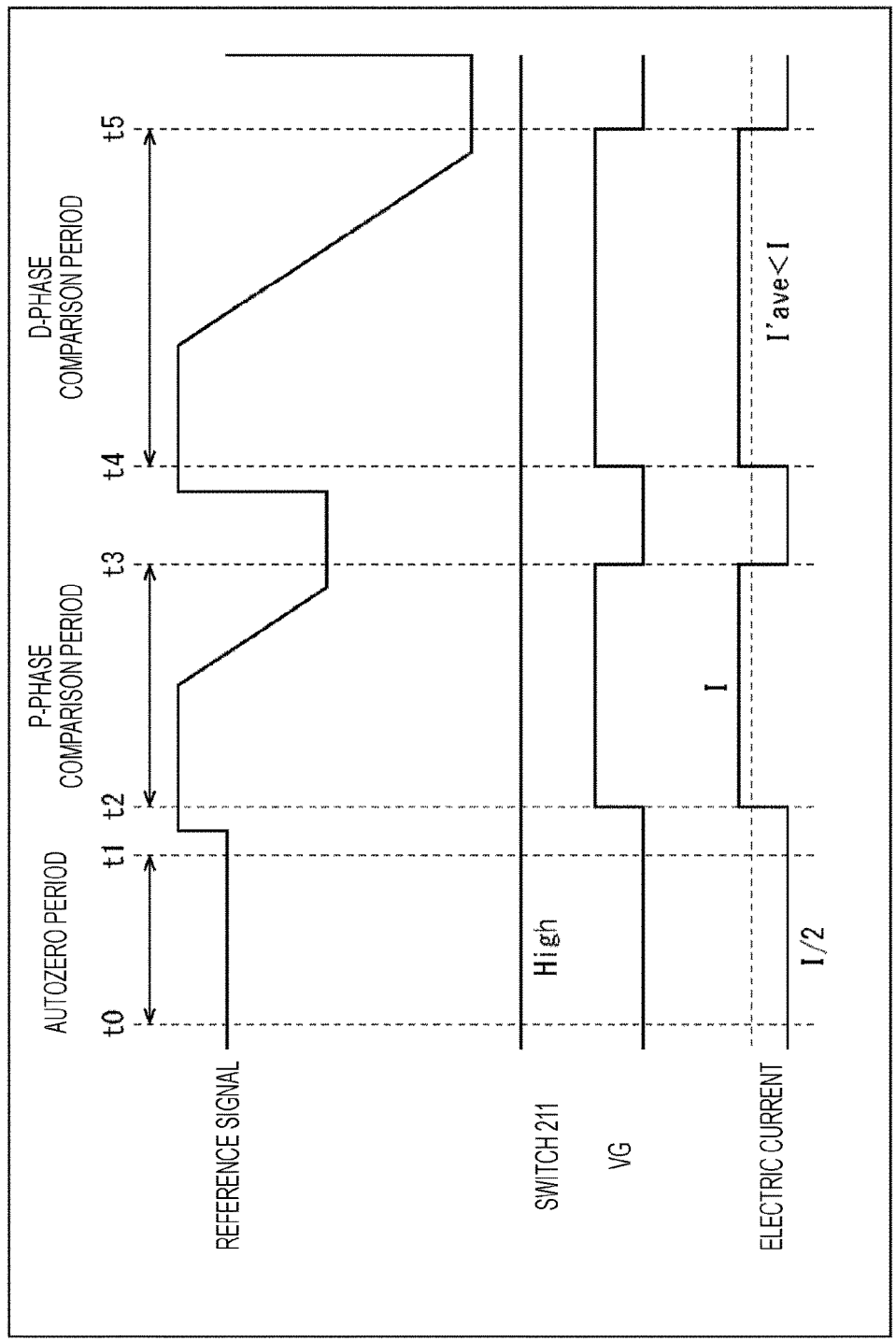
FIG. 17 is a timing chart for explaining another example of how comparison proceeds.

For example, when it is assumed that the aforementioned low electric potential is half as much as the aforementioned high electric potential, the amount of electric current supplied by the electric current source unit 252 during the period other than the comparison periods becomes half the amount of electric current I for the comparison periods (I/2), as illustrated in FIG. 17. In other words, the control unit 111 controls such that the amount of electric current is reduced during a period where a slower response speed is allowable (the period other than the comparison periods), while avoiding the reduction in the amount of electric current during the comparison periods where a sufficient response speed is required.

By carrying out such control, an average of the amount of electric current supplied by the electric current source unit 252 during the A/D conversion period (I'ave) is made smaller than the amount of electric current I for the case where the gate potential VG is constantly kept at the high electric potential (I'ave<I). Consequently, the control unit 111 is able to suppress an increase in the amount of electric power consumption of the comparison unit 181, while substantially avoiding the reduction in the response speed of the comparison unit 181.

<Reduction in Amount of Electric Current for Autozero Period>

Additionally, also in this case, as in the case of the first embodiment, when the control unit 111 reduces the amount of electric current during the autozero period where the comparison unit 181 performs the autozero (from the time point t1 to the time point t2) compared to the comparison period, the output delay in the comparison unit 181 is reduced, while the response speed thereof can be enhanced.

As described above, by controlling the amount of electric current through the control of the gate potential at the electric current source unit 252, the comparison unit 181 can be configured in a simpler manner than the case of the first embodiment and, for example, this configuration can be applied to a comparison unit 181 having the configuration as illustrated in FIG. 1. In addition, in this case, the gate potential VG can be freely adjusted and thus, the control unit 111 can freely control the amount of electric current from the electric current source unit 252. For example, the control unit 111 is also able to finely adjust the amount of decline in electric current.

<Flow of Control Processing>

Figure 18:
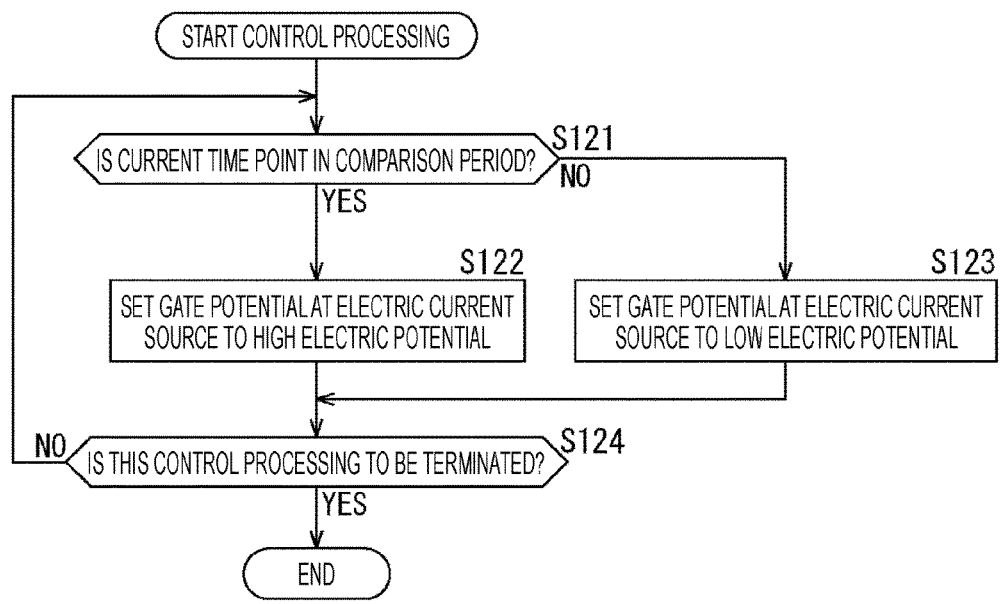
FIG. 18 is a flowchart for explaining another exemplary flow of control processing.

An exemplary flow of control processing carried out by the control unit 111 configured to carry out the control as described thus far will be described with reference to a flowchart in FIG. 18.

Once the control processing is started, the control unit 111 judges, at step S121, whether the current time point is in the comparison period (for example, the P-phase comparison period or the D-phase comparison period). When it is judged that the current time point is in the comparison period, the processing proceeds to step S122.

At step S122, the control unit 111 supplies the control signal to the VG supply unit 253 to set the gate potential at the electric current source unit 252 to the high electric potential. After this processing is completed, the processing proceeds to step S124.

Meanwhile, when it is judged at step S121 that the current time point is not in the comparison period, the processing proceeds to step S123. At step S123, the control unit 111 supplies the control signal to the VG supply unit 253 to set the gate potential at the electric current source unit 252 to the low electric potential (an electric potential less than the gate potential at step S124). After this processing is completed, the processing proceeds to step S124.

At step S124, the control unit 111 judges whether this control processing is to be terminated. When it is judged that the control processing is not to be terminated because the comparison of the signal levels (namely, the A/D conversion) by the comparison unit 181 continues, the processing returns to step S121 and the processing subsequent thereto is repeated.

When it is judged at step S124 that the control processing is to be terminated because the comparison of the signal levels (namely, the A/D conversion) by the comparison unit 181 is completed, the control processing is terminated.

By carrying out the control processing as described above, the control unit 111 can suppress an increase in electric power consumption of the comparison unit 181.

<Another Exemplary Configuration of Comparison Unit>

Also in the case of this embodiment, any configuration is employed for the comparison unit 181 as long as the amount of electric current can be controlled by the control unit 111 controlling the gate potential VG and the configuration thereof is not limited to this example. For example, as in the first embodiment, the plurality of pairs of the electric current source units and the switches may be provided. Additionally, the control unit 111 may be configured to carry out both of the control method described in the first embodiment and the control method described in this embodiment.

<3. Third Embodiment>
<Another Configuration of Comparison Unit>

Note that, when the control unit 111 reduces the amount of electric current, the control of this amount of electric current to be reduced (or the amount of reduction) may be enabled. For example, in the control method using the switch, which has been described above in the first embodiment, three or more pairs of the switches and the electric current source units may be provided in parallel such that the control unit 111 can set which switch is to be turned off during the period other than the comparison period.

Figure 19:
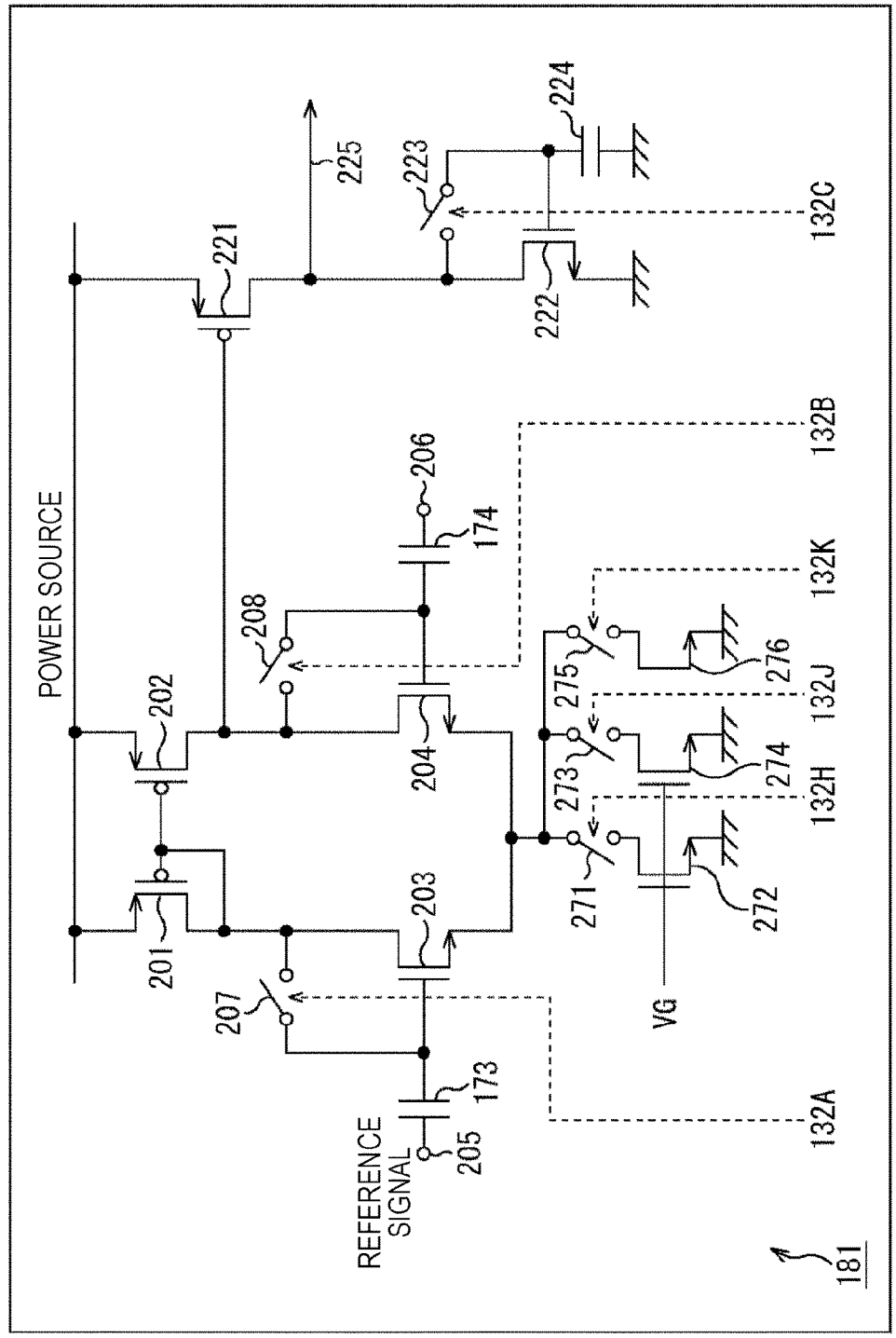
FIG. 19 is a diagram illustrating still another exemplary configuration of a comparison unit.

For example, as in the example in FIG. 19, a comparison unit 181 is assumed to include a switch 271, an electric current source unit 272, a switch 273, an electric current source unit 274, a switch 275, and an electric current source unit 276 instead of the switch 211, the electric current source unit 212, the switch 213, and the electric current source unit 214 in the example in FIG. 8. The control unit 111 is capable of switching the switch 271 between a turned-on state and a turned-off state by supplying the control signal via a control line 132H, capable of switching the switch 273 between a turned-on state and a turned-off state by supplying the control signal via a control line 132J, and capable of switching the switch 275 between a turned-on state and a turned-off state by supplying the control signal via a control line 132K.

Figure 20:
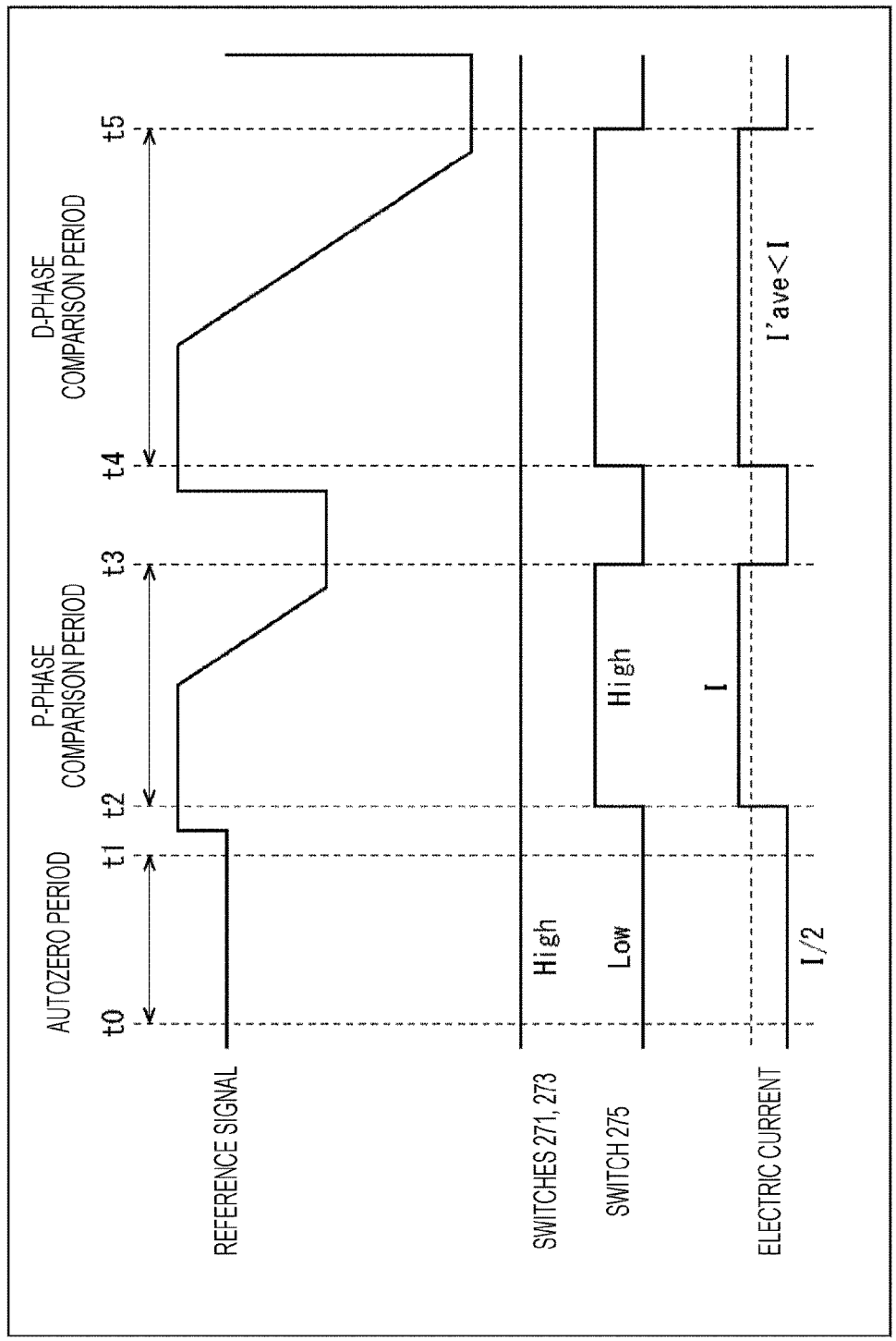
FIG. 20 is a timing chart for explaining still another example of how comparison proceeds.

In this case, for example, the control unit 111 keeps the switch 271 and the switch 273 in the ON state, while putting the switch 275 into the OFF state during the period other than the comparison period as in the example in FIG. 20, thereby being able to suppress an increase in the amount of electric power consumption of the comparison unit 181, while substantially avoiding the reduction in the response speed of the comparison unit 181. In addition to this, the control unit 111 keeps the switch 271 and the switch 275 in the ON state, while putting the switch 273 into the OFF state during the period other than the comparison period, thereby also being able to suppress an increase in the amount of electric power consumption of the comparison unit 181, while substantially avoiding the reduction in the response speed of the comparison unit 181. Furthermore, the control unit 111 keeps the switch 273 and the switch 275 in the ON state, while putting the switch 271 into the OFF state during the period other than the comparison period, or alternatively, keeps the switch 271 in the ON state, while putting the switch 273 and the switch 275 into the OFF state during the period other than the comparison period, or alternatively, keeps the switch 273 in the ON state, while putting the switch 271 and the switch 275 into the OFF state during the period other than the comparison period, or alternatively, keeps the switch 275 in the ON state, while putting the switch 271 and the switch 273 into the OFF state during the period other than the comparison period, thereby also being able to suppress an increase in the amount of electric power consumption of the comparison unit 181, while substantially avoiding the reduction in the response speed of the comparison unit 181.

Accordingly, the control unit 111 is configured to select the switch to be put into the OFF state as described above. For example, even in a case where the same transistor size is employed among the electric current source unit 272, the electric current source unit 274, and the electric current source unit 276, the amount of reduction in electric current varies depending on the number of switches to be put into the OFF state. In other words, the control unit 111 can control the amount of reduction in electric currents from the electric current source units by setting which switch is to be put into the OFF state. Particularly, in a case where the same transistor size is not employed between the electric current source unit 272, the electric current source unit 274, and the electric current source unit 276, the amount of reduction in electric currents from the electric current source units varies more variously depending on which switch is to be put into the OFF state. In other words, in this case, the control unit 111 can more variously control the amount of reduction in electric currents from the electric current source units by setting which switch is to be put into the OFF state.

In addition, the control unit 111 may be configured to select the switch to control on the basis of any type of information.

<Flow of Control Processing>

Figure 21:
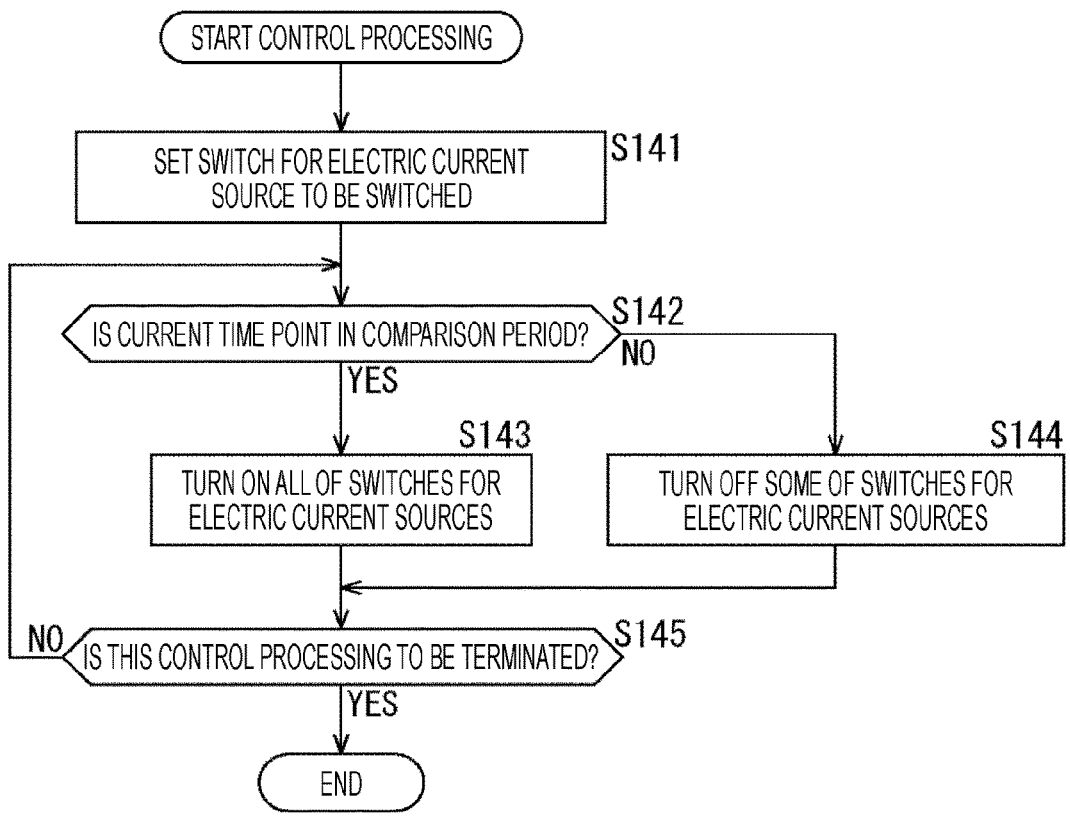
FIG. 21 is a flowchart for explaining still another exemplary flow of control processing.

An exemplary flow of control processing carried out by the control unit 111 configured to carry out the control as described thus far will be described with reference to a flowchart in FIG. 21.

Once the control processing is started, the control unit 111 sets, at step S141, which switch for electric current source is chosen (in the case of the example in FIG. 19, the switch 271, the switch 273, or the switch 275) to switch the state thereof between the comparison period and the period other than the comparison period.

The control unit 111 judges, at step S142, whether the current time point is in the comparison period (for example, the P-phase comparison period or the D-phase comparison period). When it is judged that the current time point is in the comparison period, the processing proceeds to step S143.

At step S143, the control unit 111 supplies the control signal to put all of the switches for electric current sources used to control the amount of electric currents supplied by the electric current source units into the ON state. After this processing is completed, the processing proceeds to step S145.

Meanwhile, when it is judged at step S142 that the current time point is not in the comparison period, the processing proceeds to step S144. At step S144, the control unit 111 supplies the control signal to some of the switches for electric current sources, which have been set at step S141, to put these switches for electric current sources into the OFF state. After this processing is completed, the processing proceeds to step S145.

At step S145, the control unit 111 judges whether this control processing is to be terminated. When it is judged that the control processing is not to be terminated because the comparison of the signal levels (namely, the A/D conversion) by the comparison unit 181 continues, the processing returns to step S141 and the processing subsequent thereto is repeated.

When it is judged at step S145 that the control processing is to be terminated because the comparison of the signal levels (namely, the A/D conversion) by the comparison unit 181 is completed, the control processing is terminated.

By carrying out the control processing as described above, the control unit 111 can suppress an increase in electric power consumption of the comparison unit 181.

<Another Exemplary Configuration of Comparison Unit>

Note that, also in the case of controlling the gate potential VG as in the second embodiment, the control unit 111 may be configured so as to be able to set the value of the gate potential VG to set for the period other than the comparison period.

In addition, also in the case of this embodiment, as in the cases of the first embodiment and the second embodiment, any configuration is employed for the comparison unit 181 and the configuration thereof is not limited to the above-described example.

Meanwhile, the above description has dealt with a case where a column A/D converter 161 performs the correlated double sampling. However, the present technology can be also applied to a case where A/D conversion according to a technique other than the correlated double sampling is controlled. Additionally, the above description has dealt with a case where the comparison unit 181 is used to perform the A/D conversion on the signal read from the pixel. However, the present technology can be applied to a case where the comparison unit 181 controlled by the control unit 111 is used to perform the A/D conversion on any signal. Furthermore, the present technology can be also applied to a case where the comparison unit 181 controlled by the control unit 111 is used for signal processing other than the A/D conversion. This means that the present technology can be applied to the image pickup element, while it is possible as well to apply to any signal processing apparatus other than the image pickup element.

<4. Fourth Embodiment>
<Physical Configuration of Image Sensor>

Note that the image pickup element to which the present technology is applied can be implemented as, for example, a package (chip) in which a semiconductor substrate is sealed or a module in which such a package (chip) is installed on a circuit substrate. For example, in the case of the implementation as the package (chip), the image pickup element may be constituted by a single semiconductor substrate in this package (chip), or alternatively, maybe constituted by a plurality of semiconductor substrates superimposed on one another.

Figure 22:
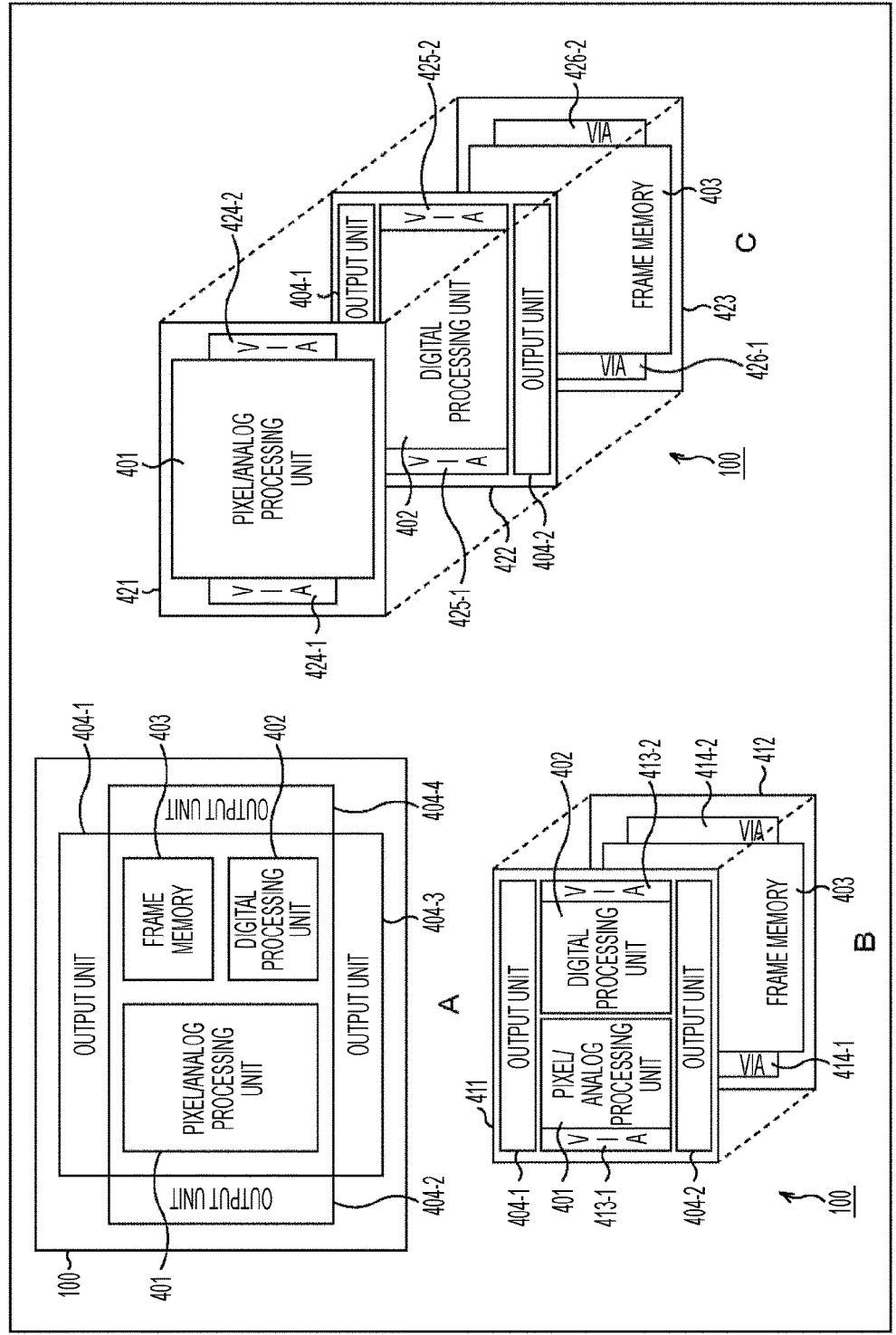
FIG. 22 is a diagram illustrating exemplary physical configurations of an image sensor.

FIG. 22 is a diagram illustrating an exemplary physical configuration of an image sensor 100 serving as the image pickup element to which the present technology is applied.

In the case of the example illustrated in A of FIG. 22, the whole circuit configuration of the image sensor 100 described with reference to FIG. 3 and so on is formed on a single semiconductor substrate. In the case of the example in A of FIG. 22, an output unit 404-1 to an output unit 404-4 are arranged so as to enclose a pixel/analog processing unit 401, a digital processing unit 402, and a frame memory 403. The pixel/analog processing unit 401 is a region where analog configurations such as a pixel array 101 and an A/D converter 103 are formed. The output unit 404-1 to the output unit 404-4 are, for example, regions where a configuration such as an I/O cell is arranged.

As a matter of course, the exemplary configuration in A of FIG. 22 serves as an example and the arrangement of the configurations of the respective processing units is not limited to this example.

In the case of the example illustrated in B of FIG. 22, the circuit configuration of the image sensor 100 described with reference to FIG. 2 and so on is formed on two semiconductor substrates superimposed on each other (a laminated substrate (a pixel substrate 411 and a circuit substrate 412)).

The pixel/analog processing unit 401, the digital processing unit 402, and the output unit 404-1 and the output unit 404-2 are formed on the pixel substrate 411. The output unit 404-1 and the output unit 404-2 are, for example, regions where a configuration such as an I/O cell is arranged.

Meanwhile, the frame memory 403 is formed on the circuit substrate 412.

As described above, the pixel substrate 411 and the circuit substrate 412 are superimposed on each other to form a multi-layer structure (laminated structure). The pixel/analog processing unit 401 formed on the pixel substrate 411 and the frame memory 403 formed on the circuit substrate 412 are electrically connected to each other via, for example, a through-via (VIA) formed in a via region (VIA) 413-1 and a via region (VIA) 414-1. Similarly, the digital processing unit 402 formed on the pixel substrate 411 and the frame memory 403 formed on the circuit substrate 412 are electrically connected to each other via, for example, a through-via (VIA) formed in a via region (VIA) 413-2 and a via region (VIA) 414-2.

The present technology can be applied to the image sensor having such a laminated structure. Note that any number of these semiconductor substrates (laminated chips) (any number of layers) is employed and, for example, three or more layers may be used as illustrated in C of FIG. 22.

In the case of the example in C of FIG. 22, the image sensor 100 includes a semiconductor substrate 421, a semiconductor substrate 422, and a semiconductor substrate 423. The semiconductor substrate 421 to the semiconductor substrate 423 are superimposed on one another to form a multi-layer structure (laminated structure). The pixel/analog processing unit 401 is formed on the semiconductor substrate 421, the digital processing unit 402 along with the output unit 404-1 and the output unit 404-2 are formed on the semiconductor substrate 422, and the frame memory 403 is formed on the semiconductor substrate 423. The respective processing units on the respective semiconductor substrates are electrically connected to one another via a through-via (VIA) formed in a via region (VIA) 424-1, a via region (VIA) 425-1, and a via region (VIA) 426-1, and a through-via (VIA) formed in a via region (VIA) 424-2, a via region (VIA) 425-2, and a via region (VIA) 426-2.

The present technology can be applied to the image sensor having such a laminated structure. As a matter of course, the processing units formed on the respective semiconductor substrates are freely chosen and not limited to the example in FIG. 22.

<Area A/D Converter>

Figure 23:
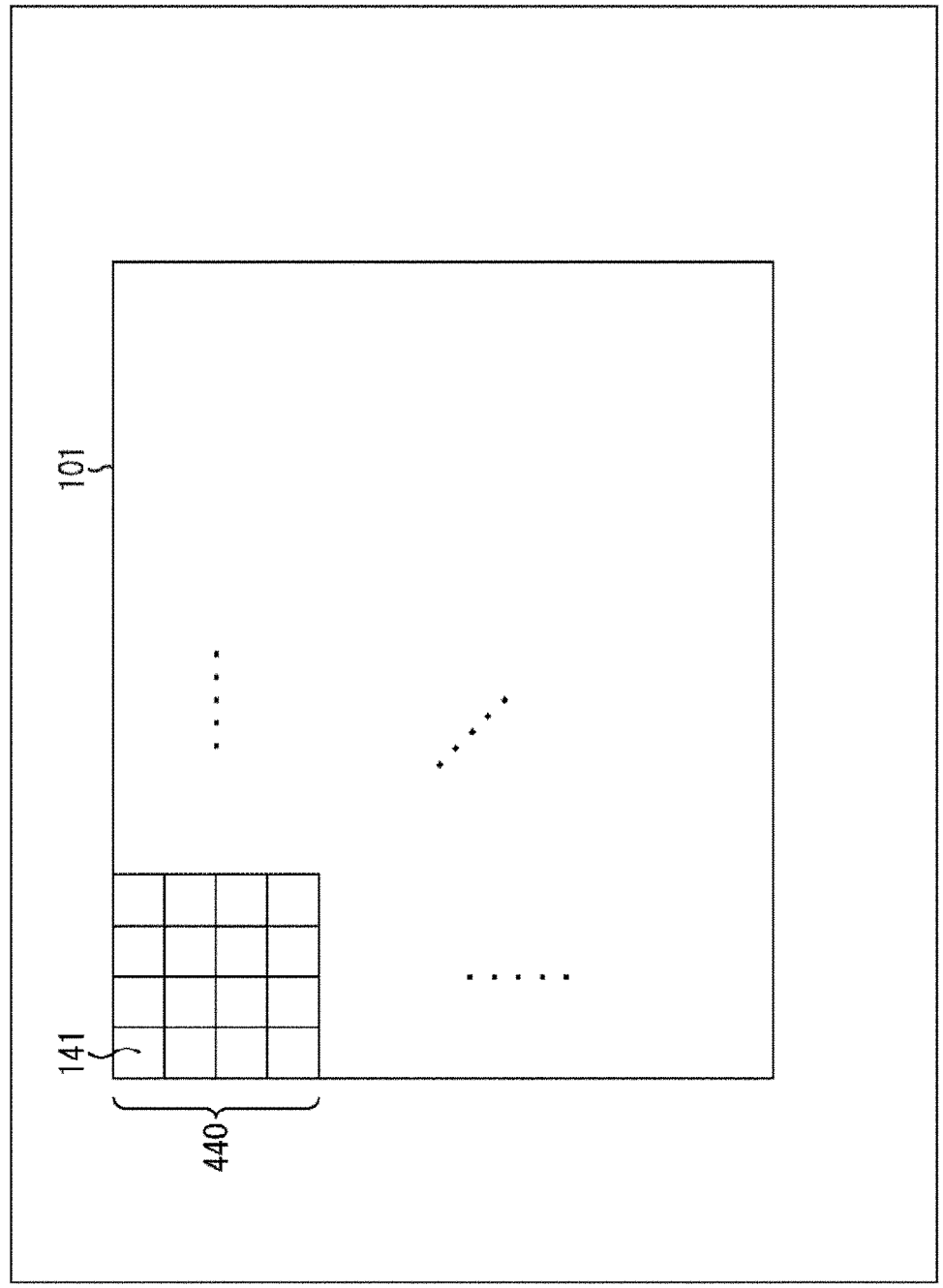
FIG. 23 is a diagram illustrating an exemplary pixel unit.

For example, the exemplary configuration of the A/D converter 103 is not limited to the example in FIG. 6. As illustrated in FIG. 23, for example, a pixel unit 440 may be formed for each group of a predetermined number of unit pixels 141 in the pixel array 101 and an A/D converter (area A/D converter) may be provided for each of these pixel units 440 in the A/D converter 103 such that each one of the area A/D converters performs the A/D conversion on the signals read from the respective unit pixels belonging to the pixel unit 440 assigned to this particular one of the area A/D converters.

The pixel unit 440 is a unit pixel group included in one of partial regions which divide the pixel region constituted by the pixel array 101 into a plurality of portions. Although the one pixel unit 440 is illustrated in FIG. 23, actually, the pixel units 440 are formed in the entire pixel array 101. That is, each of the unit pixels 141 belongs to a certain pixel unit 440.

The size of this pixel unit 440 (the number of the unit pixels 141 included in the pixel unit 440) and the shape thereof are freely set. In addition, the same size (the same number of the unit pixels 141) and the same shape may not be employed among the pixel units 440 formed in the pixel array 101.

To give an example, the pixel unit 440 is constituted by 4×4 unit pixels 141 (four rows and four columns) in the case of FIG. 23 but may be constituted by, for example, 1×8, 2×2, 2×4, 4×2, 4×8, 8×4, 8×8, 8×1, or 16×16 unit pixels 141. In addition, one pixel unit 440 may be constituted by 4×4 unit pixels 141, while another pixel unit 440 may be constituted by a certain matrix other than 4×4 such as 1×8 or 16×16 unit pixels 141.

Furthermore, although FIG. 23 illustrates each of the unit pixels 141 as a square having the same dimension, the size or the shape of each of the unit pixels 141 are freely set. The square shape may not be employed, while the same size and the same shape may not be employed thereamong.

Figure 24:
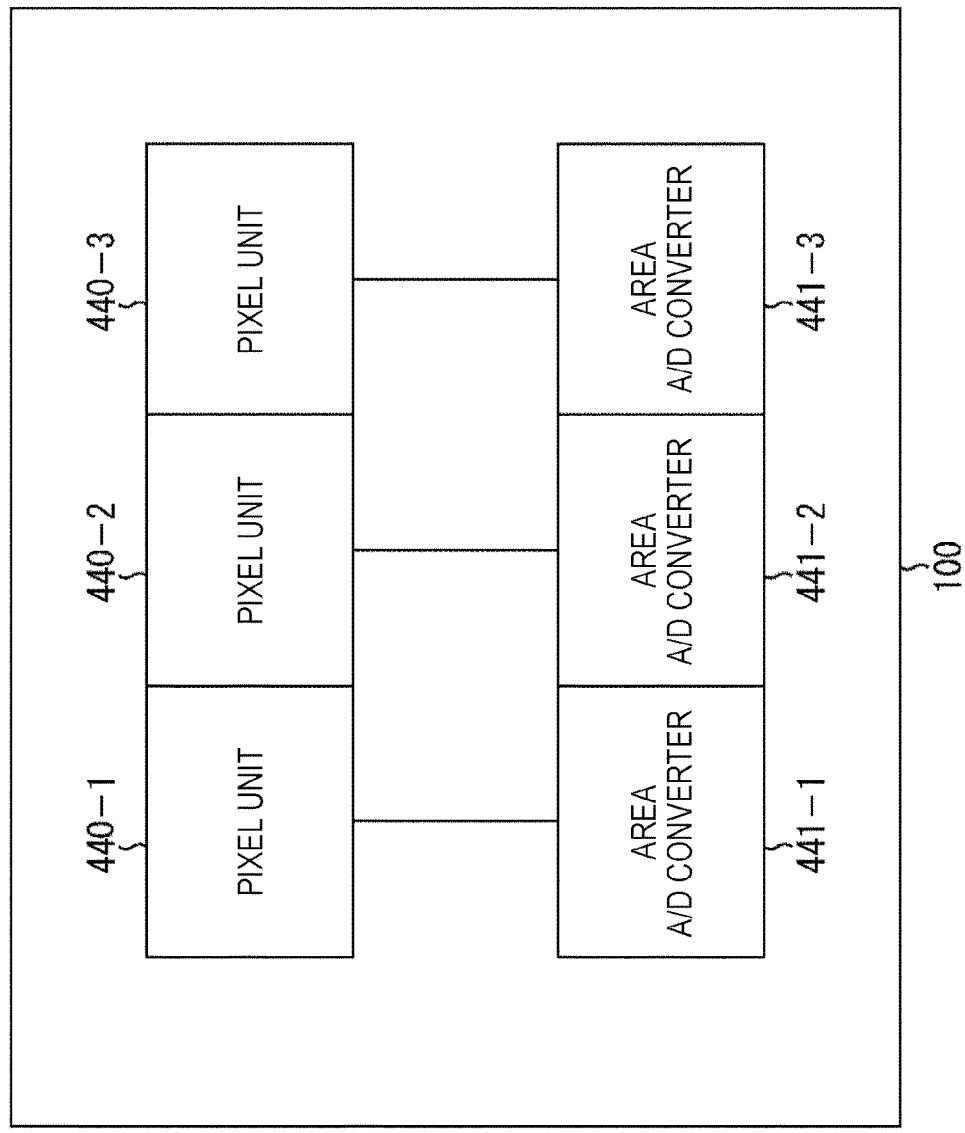
FIG. 24 is a diagram illustrating another exemplary configuration of the image sensor.

When the A/D converter (area A/D converter) is provided for each of such pixel units 440, for example, both of the pixel unit 440 and an area A/D converter 441 may be configured to be formed on one and the same semiconductor substrate, as in the example illustrated in FIG. 24. In the case of the example in FIG. 24, a pixel unit 440-1 to a pixel unit 440-3 and an area A/D converter 441-1 to an area A/D converter 441-3, which correspond to the pixel unit 440-1 to the pixel unit 440-3, respectively, are formed on the same semiconductor substrate. As a matter of course, any number of the pixel units 440 and the area A/D converters 441 is employed.

Figure 25:
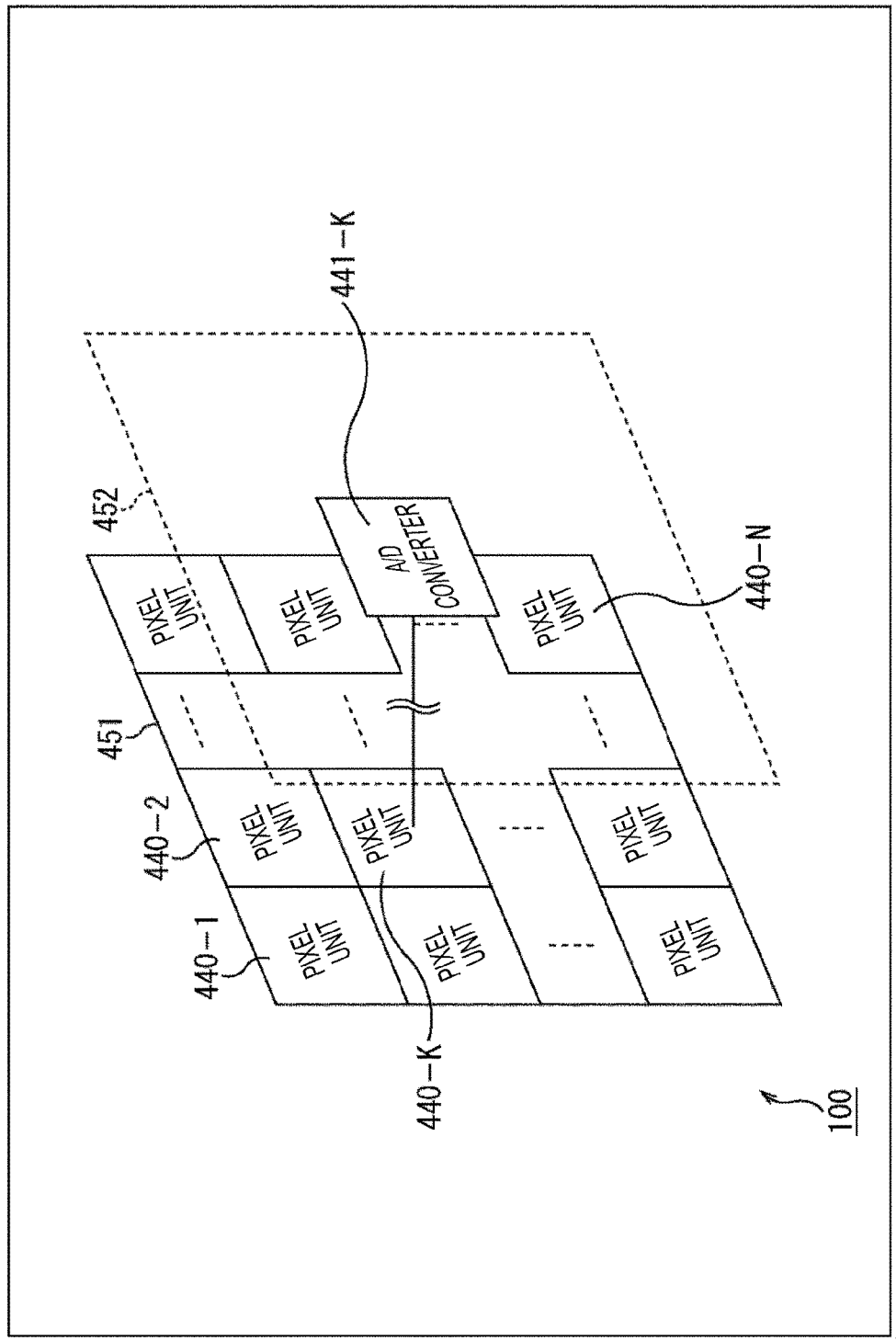
FIG. 25 is a diagram illustrating another exemplary configuration of the image sensor.

Also in this case, the configuration of the image sensor 100 may be formed on the plurality of semiconductor substrates. As illustrated in FIG. 25 as an example, the image sensor 100 may be configured to include two semiconductor substrates superimposed on each other (the laminated chip (a pixel substrate 451 and a circuit substrate 452)).

In the case of the example in FIG. 25, N number of the pixel units 440 (the pixel unit 440-1 to a pixel unit 440-N) in the pixel region (i.e., the pixel array 101) is formed on the pixel substrate 451. In addition, the area A/D converter 441 corresponding to one of the pixel units 440 is formed at a position in the circuit substrate 452 where this area A/D converter 441 is superimposed on this particular one of the pixel units 440. For example, an area A/D converter 441-K configured to perform the A/D conversion on the signals read from the unit pixels in the pixel unit 440-K is formed on the circuit substrate 452 at a position same as a position of this pixel unit 440-K on the pixel substrate 451 (a position where the area A/D converter 441-K is superimposed on the pixel unit 440-K).

Also in this case, as a matter of course, any number of the semiconductor substrates (any number of layers) is employed in the image sensor 100 and three or more layers may be used.

<5. Fifth Embodiment>
<Imaging Apparatus>

Figure 26:
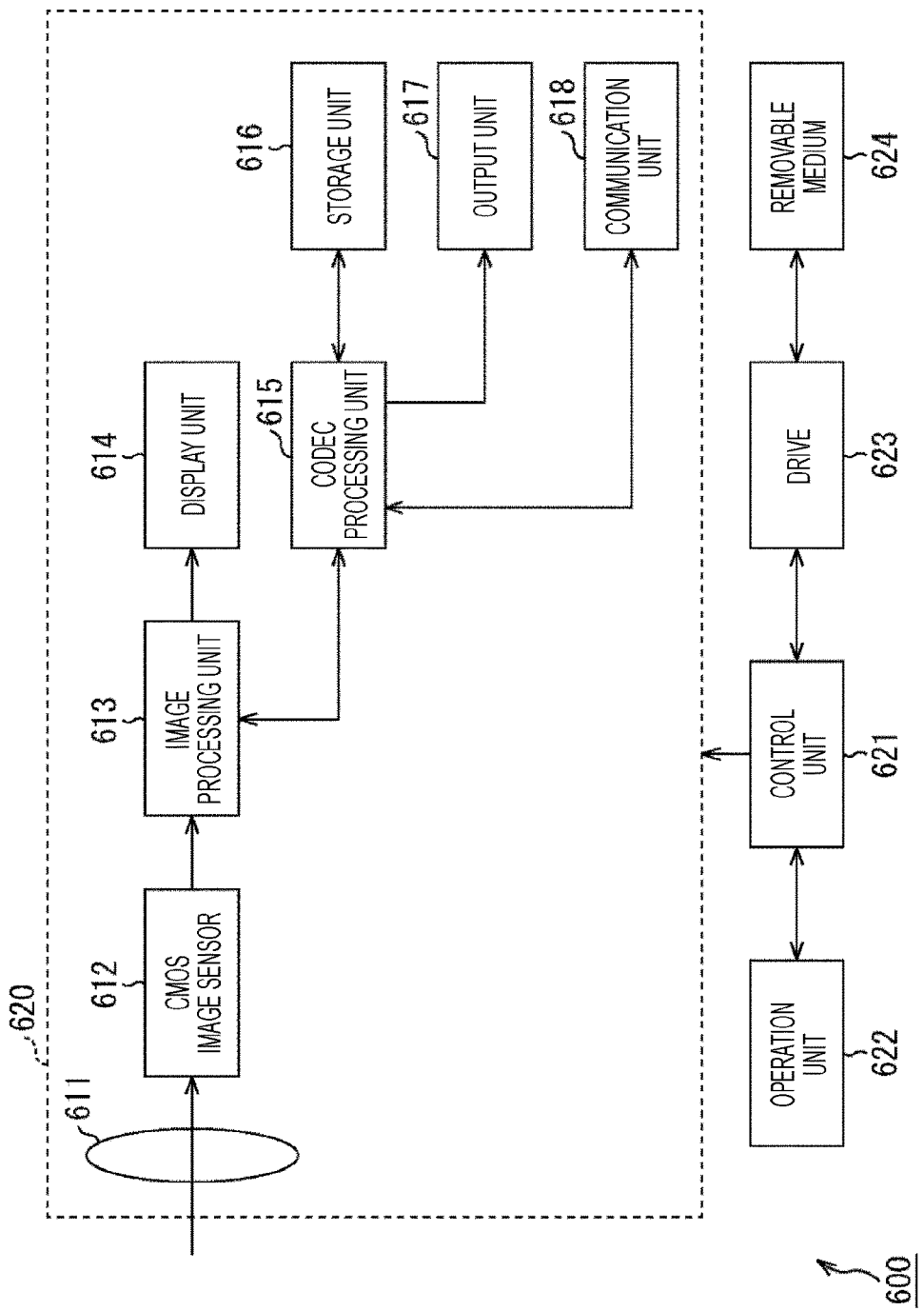
FIG. 26 is a diagram illustrating an exemplary main configuration of an imaging apparatus.

Note that the present technology can be applied to equipment other than the image pickup element. For example, the present technology may be applied to an apparatus including the image pickup element (e.g., an electronic appliance), such as an imaging apparatus. FIG. 26 is a block diagram illustrating an exemplary main configuration of an imaging apparatus serving as an exemplary electronic appliance to which the present technology is applied. The imaging apparatus 600 illustrated in FIG. 26 is an apparatus configured to image an object and then output an image of this object as an electrical signal.

As illustrate in FIG. 26, the imaging apparatus 600 includes an optical unit 611, a CMOS image sensor 612, an image processing unit 613, a display unit 614, a codec processing unit 615, a storage unit 616, an output unit 617, a communication unit 618, a control unit 621, an operation unit 622, and a drive 623.

The optical unit 611 is constituted by a lens that adjusts a focus to an object and collects light from a position in focus, a diaphragm that adjusts exposure, a shutter that controls a timing of imaging, and so on. The optical unit 611 transmits light from an object (incident light) to supply to the CMOS image sensor 612.

The CMOS image sensor 612 photoelectrically converts the incident light to perform the A/D conversion on the signal (pixel signal) from each of the pixels and then carries out the signal processing such as the CDS to supply captured image data after the processing to the image processing unit 613.

The image processing unit 613 carries out image processing on the captured image data obtained by the CMOS image sensor 612. More specifically, the image processing unit 613 applies various types of image processing to the captured image data supplied from the CMOS image sensor 612, including color mixture correction, black level correction, white balance adjustment, demosaic processing, matrix processing, gamma correction, and YC conversion. The image processing unit 613 supplies, to the display unit 614, the captured image data to which the image processing has been applied.

The display unit 614 is configured as, for example, a liquid crystal display and displays an image of the captured image data supplied from the image processing unit 613 (for example, an image of the object).

The image processing unit 613 further supplies, to the codec processing unit 615, the captured image data to which the image processing has been applied, as necessary.

The codec processing unit 615 applies encoding processing according to a predetermined technique to the captured image data supplied from the image processing unit 613 and then supplies the encoded data obtained as a result to the storage unit 616. The codec processing unit 615 also reads the encoded data recorded in the storage unit 616 to produce decoded image data through decoding and then supplies this decoded image data to the image processing unit 613.

The image processing unit 613 applies predetermined image processing to the decoded image data supplied from the codec processing unit 615. The image processing unit 613 supplies, to the display unit 614, the decoded image data to which the image processing has been applied. The display unit 614 is configured as, for example, a liquid crystal display and displays an image of the decoded image data supplied from the image processing unit 613.

In addition, the codec processing unit 615 may be configured to supply, to the output unit 617, the encoded data obtained by encoding the captured image data supplied from the image processing unit 613 or the encoded data of the captured image data read from the storage unit 616 to output to the outside of the imaging apparatus 600. The codec processing unit 615 also may be configured to supply, to the output unit 617, the captured image data before encoding or the decoded image data obtained by decoding the encoded data read from the storage unit 616 to output to the outside of the imaging apparatus 600.

Furthermore, the codec processing unit 615 may be configured to transmit the captured image data, the encoded data of the captured image data, or the decoded image data to another apparatus via the communication unit 618. Additionally, the codec processing unit 615 may be configured to acquire the captured image data and the encoded data of the image data via the communication unit 618. The codec processing unit 615, for example, encodes and decodes the captured image data and the encoded data of the image data acquired via the communication unit 618 as appropriate. The codec processing unit 615 may be configured to supply, to the image processing unit 613, the image data or the encoded data that has been obtained, as described above, and also may be configured to output such data to the storage unit 616, the output unit 617, and the communication unit 618.

The storage unit 616 stores the encoded data and so on supplied from the codec processing unit 615. The encoded data saved and kept in the storage unit 616 is read by the codec processing unit 615 to be decoded as necessary. The captured image data obtained through the decoding processing is supplied to the display unit 614 such that a captured image corresponding to this captured image data is displayed.

The output unit 617 includes an external output interface such as an external output terminal to output various types of data supplied via the codec processing unit 615 to the outside of the imaging apparatus 600 via this external output interface.

The communication unit 618 supplies various types of information such as the image data and the encoded data supplied from the codec processing unit 615 to another apparatus serving as a communication peer in predetermined communication (wired communication or wireless communication). The communication unit 618 also acquires various types of information such as the image data and the encoded data from another apparatus serving as a communication peer in predetermined communication (wired communication or wireless communication) and then supplies such information to the codec processing unit 615.

The control unit 621 controls actions of the respective processing units of the imaging apparatus 600 (the respective processing units illustrated within a dotted line 620, the operation unit 622, and the drive 623).

The operation unit 622 is constituted by any input device such as Jog Dial (trademark), a key, a button, or a touch panel to accept operation input by a user or the like and then supply a signal corresponding to this operation input to the control unit 621.

The drive 623 reads information stored in a removable medium 624 mounted in this drive 623, such as a magnetic disk, an optical disc, a magneto-optical disk, or a semiconductor memory. The drive 623 reads various types of information such as a program and data from the removable medium 624 and then supplies such information to the control unit 621. In addition, when the writable removable medium 624 is mounted in the drive 623, this drive 623 can store various types of information such as the image data and the encoded data supplied via the control unit 621 to this removable medium 624.

The present technology described thus far in the respective embodiments is applied as the CMOS image sensor 612 of the imaging apparatus 600 as described above. Specifically, the above-described image sensor 100 is used as the CMOS image sensor 612. With this, the CMOS image sensor 612 can suppress an increase in electric power consumption. Consequently, the imaging apparatus 600 can suppress an increase in electric power consumption as well.

A series of the above-described processing can be carried out by using hardware as well and also can be carried out by using software. When the series of the above-described processing is carried out by software, a program constituting the software is installed from a network or a recording medium.

As illustrated in FIG. 26, this recording medium is constituted by, for example, the removable medium 624 separately from the apparatus itself, in which the program is recorded such that the removable medium 624 is distributed to a user to deliver the program thereto. This removable medium 624 includes a magnetic disk (including a flexible disk) and an optical disc (including a CD-ROM and a DVD). Furthermore, a magneto-optical disk (including a mini disc (MD)) and a semiconductor memory are also included therein.

In this case, the program can be installed to the storage unit 616 by mounting such a removable medium 624 in the drive 623.

In addition, this program can be also provided via a wired or wireless transmission medium such as a local area network, the Internet, or digital satellite broadcasting. In this case, the program can be received by the communication unit 618 to be installed to the storage unit 616.

As an alternative manner, this program can be also installed to the storage unit 616, a read only memory (ROM) within the control unit 621, or the like in advance.

Note that, the program executed by a computer may be a program in which the processing is carried out along the time series in accordance with the order described in the present description, or alternatively, may be a program in which the processing is carried out in parallel or at a necessary timing, for example, when called.

In addition, in the present description, steps describing the program to be recorded in a recording medium off course include processing carried out along the time series in accordance with the order in which the steps are described and additionally include processing not necessarily processed along the time series but carried out in a parallel manner or individually.

Furthermore, the processing by the aforementioned steps can be carried out by the aforementioned respective apparatuses or any apparatus other than the aforementioned respective apparatuses. In such a case, the apparatus which is to carry out that processing is simply configured to have a function required to carry out that aforementioned processing (e.g., a function block). In addition, information required for the processing can be configured to be transmitted to that apparatus as appropriate.

Meanwhile, in the present description, the system refers to a collection of a plurality of constituent members (e.g., apparatuses and modules (components)) and whether all the constituent members are arranged within the same cabinet is not regarded as important. Therefore, a plurality of apparatuses accommodated in separate cabinets so as to be connected to one another via a network and one apparatus of which a plurality of modules is accommodated within one cabinet are both deemed as systems.

Additionally, in the aforementioned cases, a configuration described as one apparatus (or a processing unit) may be divided so as to be configured as a plurality of apparatuses (or processing units). Or conversely, in the aforementioned cases, a configuration described as a plurality of apparatuses (or processing units) may be integrated so as to be configured as one apparatus (or a processing unit). In addition, as a matter of course, a configuration other than those described above may be employed to be added to the configurations of the respective apparatuses (or the respective processing units). Furthermore, a portion of a certain apparatus (or a certain processing unit) may be configured to be included in the configuration of another apparatus (or another processing unit) as long as the configuration or the action of the system as a whole is maintained substantially unchanged.

The favorable embodiments of the present disclosure have been described in detail thus far with reference to the accompanying drawings. However, the technological scope of the present disclosure is not limited to these examples. It is clear that a person with average knowledge on the technological field of the present disclosure can arrive at various variations or modifications within a range of the technological spirit disclosed in claims and as a matter of course, these are comprehended as part of the technological scope of the present disclosure.

For example, the present technology can employ a cloud computing configuration in which one function is divided and allocated to a plurality of apparatuses so as to be processed in coordination thereamong via a network.

In addition, the respective steps described in the aforementioned flowcharts can be carried out by a plurality of apparatuses each taking a share thereof as well as carried out by a single apparatus.

Furthermore, when a plurality of processing tasks is included in one step, the plurality of processing tasks included in one step can be carried out by a plurality of apparatuses each taking a share thereof as well as carried out by a single apparatus.

Additionally, the present technology is not limited thereto and can be also carried out as any configuration equipped in an apparatus constituting the apparatus or the system described above, for example, a processor serving as system large scale integration (LSI) or the like, a module using a plurality of processors or the like, a unit using a plurality of modules or the like, a set in which another function is further added to a unit, or the like (that is, a partial configuration of an apparatus).

Note that the present technology can be also configured as described below.

(1) A signal processing apparatus including a control unit that controls an amount of electric current at a differential stage in a comparison unit configured to compare signal levels of a plurality of signals and, compared to a comparison period serving as a period during which the comparison unit compares the signal levels of the plurality of signals, reduces the amount of electric current for a period other than the comparison period.

(2) The signal processing apparatus according to (1), in which the comparison unit includes, in the differential stage, a plurality of pairs of electric current source units each configured to supply an electric current and switches each capable of disconnecting a path of the electric current from the electric current source unit, which pairs are interconnected in parallel, and by turning off the switch to disconnect the path of the electric current supplied by the electric current source unit for some of the plurality of pairs, the control unit reduces the amount of electric current for the period other than the comparison period.

(3) The signal processing apparatus according to (2), in which the control unit sets the switch to be turned off and turns off the set switch during the period other than the comparison period.

(4) The signal processing apparatus according to any one of (1) to (3), in which the comparison unit includes, in the differential stage, an electric current source unit configured to supply an electric current, and by causing a gate potential at the electric current source unit to decrease, the control unit reduces the amount of electric current for the period other than the comparison period.

(5) The signal processing apparatus according to any one of (1) to (4), in which the control unit reduces the amount of electric current for an autozero period of the comparison unit, compared to the comparison period.

(6) The signal processing apparatus according to any one of (1) to (5), further including the comparison unit.

(7) The signal processing apparatus according to (6), further including a counter that performs counting until a result of the comparison of the signal levels among the plurality of signals by the comparison unit changes.

(8) The signal processing apparatus according to (7), in which the plurality of signals includes a predetermined reference signal and a signal read from a unit pixel.

(9) The signal processing apparatus according to (8), in which the comparison unit:

compares the reference signal and a reset signal read from the unit pixel during a reset period of correlated double sampling; and compares the reference signal and a pixel signal read from the unit pixel during a signal reading period of the correlated double sampling, and compared to the comparison period during the reset period and the comparison period during the signal reading period, the control unit reduces the amount of electric current for the period other than the comparison periods.

(10) A control method that controls an amount of electric current at a differential stage in a comparison unit configured to compare signal levels of a plurality of signals and, compared to a comparison period serving as a period during which the comparison unit compares the signal levels of the plurality of signals, reduces the amount of electric current for a period other than the comparison period.

(11) An image pickup element including:

a pixel array in which a plurality of unit pixels is arranged in a matrix form;

a comparison unit that compares signal levels between a signal read from the unit pixel in the pixel array and a predetermined reference signal;

a counter that performs counting until a result of the comparison of the signal levels by the comparison unit changes; and a control unit that controls an amount of electric current at a differential stage in the comparison unit and, compared to a comparison period serving as a period during which the comparison unit compares the signal levels between the signal read from the unit pixel and the reference signal, reduces the amount of electric current for a period other than the comparison period.

(12) An electronic appliance including:

an imaging unit that images an object; and an image processing unit that carries out image processing on image data obtained through imaging by the imaging unit, in which the imaging unit includes:

a pixel array in which a plurality of unit pixels is arranged in a matrix form;

a comparison unit that compares signal levels between a signal read from the unit pixel in the pixel array and a predetermined reference signal;

a counter that performs counting until a result of the comparison of the signal levels by the comparison unit changes; and a control unit that controls an amount of electric current at a differential stage in the comparison unit and, compared to a comparison period serving as a period during which the comparison unit compares the signal levels between the signal read from the unit pixel and the reference signal, reduces the amount of electric current for a period other than the comparison period.

REFERENCE SIGNS LIST

100 Image sensor
101 Pixel array
102 Reference voltage generator
103 A/D converter
104 Horizontal transfer unit
111 Control unit
112 Vertical scanner
121 Vertical signal line
122 Reference signal line
123 and 124 Signal line
125 Control line
131 to 134 Control line
141 Unit pixel
161 Column A/D converter
171 Comparison unit
172 Counter
173 and 174 Capacitor
181 Comparison unit
201 to 204 Transistor
205 and 206 Input terminal
207 and 208 Switch
211 Switch
212 Electric current source unit
213 Switch
214 Electric current source unit
221 and 222 Transistor
223 Switch
224 Capacitor 225 Output terminal
251 Switch
252 Electric current source
253 VG supply unit
271 Switch
272 Electric current source unit
273 Switch
274 Electric current source unit
275 Switch
276 Electric current source unit
600 Imaging apparatus
612 CMOS image sensor

What is claimed is:

1. A signal processing apparatus, comprising:
a control unit;
a comparison unit,
wherein the control unit controls an amount of electric current at a differential stage in the comparison unit,
wherein the comparison unit is configured to compare signal levels of a plurality of signals and, compared to a comparison period serving as a period during which the comparison unit compares the signal levels of the plurality of signals, reduces the amount of electric current for a period other than the comparison period,
wherein the comparison unit includes, in the differential stage, an electric current source unit configured to supply an electric current to the differential stage, the electric current source unit having a drain connected to sources of transistors of the differential stage by a switch, having a source connected to ground, and having a gate connected to a gate potential (VG) supply unit, and
wherein by causing a gate potential at the electric current source unit to decrease, the control unit reduces the amount of electric current for the period other than the comparison period; and
a counter that performs counting until a result of the comparison of the signal levels among the plurality of signals by the comparison unit changes, wherein the plurality of signals includes a predetermined reference signal and a signal read from a unit pixel, and
wherein the comparison unit:
compares the predetermined reference signal and a reset signal read from the unit pixel during a reset period of correlated double sampling; and
compares the predetermined reference signal and a pixel signal read from the unit pixel during a signal reading period of the correlated double sampling, and
compared to the comparison period during the reset period and the comparison period during the signal reading period, the control unit reduces the amount of electric current for the period other than the comparison periods.

2. The signal processing apparatus according to claim 1, wherein
the control unit sets the switch to be turned off and turns off the set switch during the period other than the comparison period.

3. The signal processing apparatus according to claim 1, wherein
the control unit reduces the amount of electric current for an autozero period of the comparison unit, compared to the comparison period.

4. A control method, comprising:
using a control unit, controlling an amount of electric current at a differential stage in a comparison unit configured to compare signal levels of a plurality of signals and, compared to a comparison period serving as a period during which the comparison unit compares the signal levels of the plurality of signals, reducing the amount of electric current for a period other than the comparison period, wherein the comparison unit includes, in the differential stage, an electric current source unit configured to supply an electric current to the differential stage, the electric current source unit having a drain connected to sources of transistors of the differential stage by a switch, having a source connected to ground, and having a gate connected to a gate potential (VG) supply unit, and wherein by causing a gate potential at the electric current source unit to decrease, the control unit reduces the amount of electric current for the period other than the comparison period; and
using a counter, performing counting until a result of the comparison of the signal levels among the plurality of signals by the comparison unit changes, wherein the plurality of signals includes a predetermined reference signal and a signal read from a unit pixel, and
wherein the comparison unit:
compares the predetermined reference signal and a reset signal read from the unit pixel during a reset period of correlated double sampling; and
compares the predetermined reference signal and a pixel signal read from the unit pixel during a signal reading period of the correlated double sampling, and
compared to the comparison period during the reset period and the comparison period during the signal reading period, the control unit reduces the amount of electric current for the period other than the comparison periods.

5. An image pickup element comprising:
a pixel array in which a plurality of unit pixels is arranged in a matrix form;
a comparison unit that compares signal levels between a plurality of signals read from a unit pixel in the pixel array and a predetermined reference signal;
a counter that performs counting until a result of the comparison of the signal levels by the comparison unit changes, wherein the plurality of signals includes the predetermined reference signal and a signal read from the unit pixel; and
a control unit that controls an amount of electric current at a differential stage in the comparison unit and, compared to a comparison period serving as a period during which the comparison unit compares the signal levels between the signal read from the unit pixel and the predetermined reference signal, reduces the amount of electric current for a period other than the comparison period, wherein the comparison unit includes an electric current source unit having a drain connected to sources of transistors of the differential stage by a switch, having a source connected to ground, and having a gate connected to a gate potential (VG) supply unit, and wherein the control unit controls the amount of electric current at the differential stage by controlling a voltage supplied to the gate of the electric current source unit by the VG supply unit, wherein by causing a gate potential at the electric current source unit to decrease, the control unit reduces the amount of electric current for the period other than the comparison period, and wherein the comparison unit:
compares the predetermined reference signal and a reset signal read from the unit pixel during a reset period of correlated double sampling; and
compares the predetermined reference signal and a pixel signal read from the unit pixel during a signal reading period of the correlated double sampling, and
compared to the comparison period during the reset period and the comparison period during the signal reading period, the control unit reduces the amount of electric current for the period other than the comparison periods.

6. An electronic appliance comprising:
an imaging unit that images an object; and
an image processing unit that carries out image processing on image data obtained through imaging by the imaging unit, wherein
the imaging unit includes:
a pixel array in which a plurality of unit pixels is arranged in a matrix form;
a comparison unit that compares signal levels between a plurality of signals read from a unit pixel in the pixel array and a predetermined reference signal;
a counter that performs counting until a result of the comparison of the signal levels by the comparison unit changes, wherein the plurality of signals includes the predetermined reference signal and a signal read from the unit pixel; and
a control unit that controls an amount of electric current at a differential stage in the comparison unit and, compared to a comparison period serving as a period during which the comparison unit compares the signal levels between the signal read from the unit pixel and the predetermined reference signal, reduces the amount of electric current for a period other than the comparison period, wherein the comparison unit includes an electric current source unit having a drain connected to sources of transistors of the differential stage by a switch, having a source connected to ground, and having a gate connected to a gate potential (VG) supply unit, wherein the control unit controls the amount of electric current at the differential stage by controlling a voltage supplied to the gate of the electric current source unit by the VG supply unit, wherein by causing a gate potential at the electric current source unit to decrease, the control unit reduces the amount of electric current for the period other than the comparison period, and
wherein the comparison unit:
compares the predetermined reference signal and a reset signal read from the unit pixel during a reset period of correlated double sampling; and
compares the predetermined reference signal and a pixel signal read from the unit pixel during a signal reading period of the correlated double sampling, and
compared to the comparison period during the reset period and the comparison period during the signal reading period, the control unit reduces the amount of electric current for the period other than the comparison periods.

* * * * *